(12) United States Patent
Jo

(10) Patent No.: US 11,631,458 B2
(45) Date of Patent: Apr. 18, 2023

(54) MEMORY DEVICE INCLUDING AN OVONIC THRESHOLD SWITCH ELEMENT AND A METHOD OF OPERATING THEREOF

(71) Applicant: Samsung Electronics Co., Ltd., Suwon-si (KR)

(72) Inventor: Sungkyu Jo, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 36 days.

(21) Appl. No.: 17/322,078

(22) Filed: May 17, 2021

(65) Prior Publication Data

US 2022/0115058 A1    Apr. 14, 2022

(30) Foreign Application Priority Data

Oct. 14, 2020    (KR) .................. 10-2020-0132573

(51) Int. Cl.
*G11C 7/12*    (2006.01)
*G11C 13/00*    (2006.01)

(52) U.S. Cl.
CPC ........ *G11C 13/003* (2013.01); *G11C 13/0004* (2013.01); *G11C 13/004* (2013.01); *G11C 13/0026* (2013.01); *G11C 13/0028* (2013.01); *G11C 13/0033* (2013.01); *G11C 13/0069* (2013.01)

(58) Field of Classification Search
CPC .............. G11C 13/003; G11C 13/0004; G11C 13/0026; G11C 13/0028; G11C 13/0033; G11C 13/004; G11C 13/0069
See application file for complete search history.

(56) References Cited

U.S. PATENT DOCUMENTS 7,945,825 B2    5/2011    Cohen et al.
8,254,183 B2    8/2012    Park
(Continued)

FOREIGN PATENT DOCUMENTS

| CN | 114927153 A | * | 8/2022 | .......... G06F 11/1068 |
| KR | 10-2018-0043431 A | | 4/2018 | |
| KR | 10-2020-0022213 A | | 3/2020 | |

OTHER PUBLICATIONS

US 9,583,185 B1, 02/2017, Robustelli (withdrawn)

*Primary Examiner* — Mushfique Siddique
(74) *Attorney, Agent, or Firm* — Harness, Dickey & Pierce, P.L.C.

(57) ABSTRACT

A memory device includes a cell area in which a plurality of word lines, a plurality of bit lines, and a plurality of memory cells connected to the plurality of word lines and the plurality of bit lines are disposed, each of the plurality of memory cells including an Ovonic threshold switch element and a memory element connected to each other in series, and a peripheral circuit area including at least one peripheral circuit, configured to input a first refresh voltage turning on the Ovonic threshold switch element to each of at least some refresh cells among the plurality of memory cells to execute a refresh operation, determine each of the refresh cells as a first refresh cell in a first state or a second refresh cell in a second state while the Ovonic threshold switch element is turned on, and input a second refresh voltage, different to the first refresh voltage, to the second refresh cell.

18 Claims, 14 Drawing Sheets

(56) References Cited

U.S. PATENT DOCUMENTS

| | | | |
|---|---|---|---|
| 9,275,730 B2* | 3/2016 | Tortorelli | G11C 13/0004 |
| 9,824,767 B1 | 11/2017 | Mantegazza et al. | |
| 2012/0075924 A1* | 3/2012 | Kau | G11C 13/0061 |
| | | | 365/163 |
| 2015/0089120 A1 | 3/2015 | Pangal et al. | |
| 2016/0189774 A1 | 6/2016 | Xie et al. | |
| 2017/0243643 A1* | 8/2017 | Robustelli | G06F 13/1657 |
| 2017/0358350 A1* | 12/2017 | Kim | G11C 13/004 |
| 2018/0108408 A1 | 4/2018 | Kwon | |
| 2019/0043580 A1* | 2/2019 | Pirovano | G11C 13/0033 |
| 2019/0172502 A1* | 6/2019 | Jeong | G11C 5/025 |
| 2019/0206489 A1* | 7/2019 | Wang | G11C 13/0069 |
| 2020/0066342 A1 | 2/2020 | Ha | |
| 2021/0098062 A1* | 4/2021 | Kwon | G11C 5/025 |
| 2021/0255916 A1* | 8/2021 | Im | G11C 13/0064 |

* cited by examiner

MEMORY DEVICE INCLUDING AN OVONIC THRESHOLD SWITCH ELEMENT AND A METHOD OF OPERATING THEREOF

CROSS-REFERENCE TO RELATED APPLICATION(S)

This application claims the benefit under 35 USC 119(a) of Korean Patent Application No. 10-2020-0132573 filed on Oct. 14, 2020 in the Korean Intellectual Property Office, the entire disclosure of which is incorporated herein by reference for all purposes.

BACKGROUND

The present inventive concepts relate to a memory device.

A memory device may provide a function of writing and erasing data or reading recorded data. The memory device may include a plurality of memory cells, and program or erase data by adjusting a threshold voltage of each of the memory cells. A threshold voltage distribution of the memory cells may be an important factor in reading data stored in the memory cells.

SUMMARY

Example embodiments provide a memory device with improved reliability by detecting threshold voltages of memory cells during a period in which a first refresh voltage is input to the memory cell in a refresh operation and a second refresh voltage is additionally input to at least some of the memory cells to improve a distribution of the threshold voltages, and an operating method thereof.

According to example embodiments, a memory device includes a cell area in which a plurality of word lines, a plurality of bit lines, and a plurality of memory cells connected to the plurality of word lines and the plurality of bit lines are disposed, each of the plurality of memory cells including an Ovonic threshold switch element and a memory element connected to each other in series, and a peripheral circuit area including at least one peripheral circuit configured to input a first refresh voltage turning on the Ovonic threshold switch element to each of at least some refresh cells among the plurality of memory cells to execute a refresh operation, determine each of the refresh cells as a first refresh cell in a first state or a second refresh cell in a second state while the Ovonic threshold switch element is turned on, and input a second refresh voltage, different from the first refresh voltage, to the second refresh cell.

According to example embodiments, a memory device includes a cell area including a plurality of memory cells connected to a plurality of word lines and a plurality of bit lines, each of the plurality of memory cells having a threshold voltage lower than or equal to a first threshold voltage or higher than or equal to a second threshold voltage higher than the first threshold voltage by a programming operation, and a peripheral circuit area including at least one peripheral circuit connected to the plurality of word lines and the plurality of bit lines and configured to input a post voltage to target memory cells, among the plurality of memory cells, after a control operation, wherein each of the target memory cells have a threshold voltage higher than or equal to the second threshold voltage. The control operation is a refresh operation of turning on a switch element included in each of at least some refresh cells of the plurality of memory cells.

According to example embodiments, a memory device includes a plurality of word lines extending in a first direction, a plurality of bit lines extending in a second direction, intersecting the first direction and separated from the plurality of word lines in a third direction, intersecting the first direction and the second direction, a plurality of memory cells connected to the plurality of word lines and the plurality of bit lines, and a peripheral circuit area including at least one peripheral circuit connected to the plurality of word lines and the plurality of bit lines, and configured to execute sequentially a first refresh operation and a second refresh operation for refresh cells of the plurality of memory cells. The at least one peripheral circuit is configured to input a first refresh voltage to the refresh cells during the first refresh operation, and input a second refresh voltage, higher than the first refresh voltage, to only a portion of the refresh cells, to execute the second refresh operation.

According to example embodiments, an operating method of a memory device includes receiving a refresh command from an external memory controller, inputting a first refresh voltage to at least some refresh cells of memory cells, classifying the refresh cells into first refresh cells and second refresh cells during a period in which the first refresh voltage is input to the refresh cells, the first refresh cells having threshold voltages lower than or equal to a first threshold voltage and the second refresh cells having threshold voltages higher than or equal to a second threshold voltage, different from the first threshold voltage, and inputting a second refresh voltage, higher than or equal to the first refresh voltage only to the second refresh cells. When the first threshold voltage is greater than the second threshold voltage, the second refresh voltage is equal to the first refresh voltage, and when the first threshold voltage is lower than the second threshold voltage, the second refresh voltage is greater than the first refresh voltage.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, an example embodiments will be described with reference to the accompanying drawings.

Figure 1:
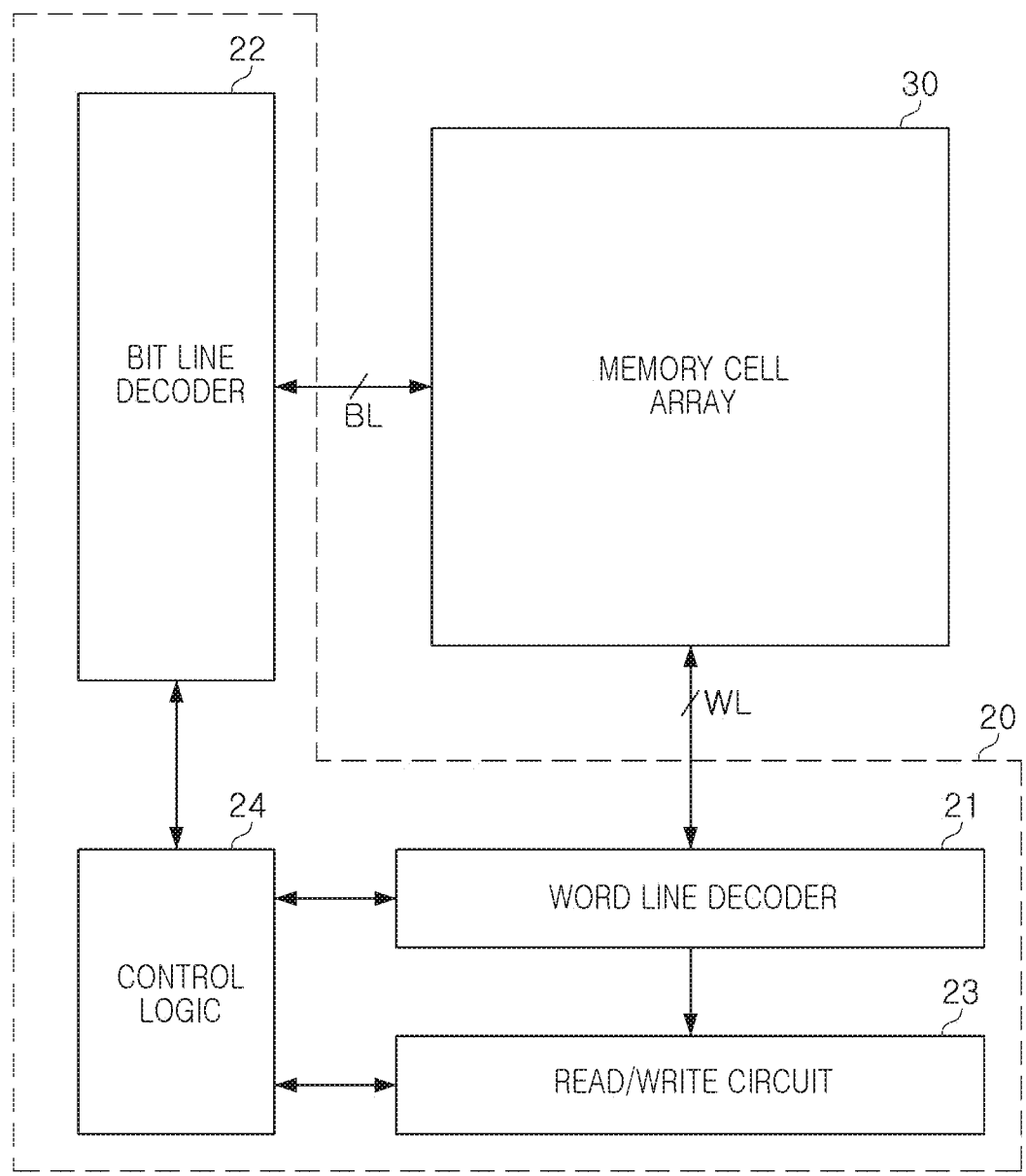
FIG. 1 is a schematic block diagram illustrating a memory device according to example embodiments.

FIG. 1 is a schematic block diagram illustrating a memory device according to example embodiments.

A memory device 10 according to example embodiments may include a peripheral circuit area 20 and a cell area 30. The peripheral circuit area 20 may include at least one peripheral circuit, including for example, decoder circuits 21 and 22, read/write circuits 23, a control logic 24, and/or the like. The cell area 30 may include a plurality of memory cells.

The decoder circuits 21 and 22 may include a word line decoder 21 connected to a plurality of memory cells through word lines WL and a bit line decoder 22 connected to a plurality of memory cells through bit lines BL. Operations of the word line decoder 21, the bit line decoder 22, and the read/write circuit 23 may be controlled by the control logic 24. In example embodiments, the read/write circuit 23 may include a program circuit writing data to at least one selected memory cell specified by the word line decoder 21 and the bit line decoder 22, a readout circuit reading out data from the selected memory cell, and/or the like.

The control logic 24 may determine a selected memory cell among the memory cells included in the cell area 30 through the word line decoder 21 and the bit line decoder 22. The control logic 24 may execute a programming operation, a read operation, a refresh operation, or the like, for the selected memory cell by inputting a predetermined or alternatively, desired bias to each of a selected word line and a selected bit line connected to the selected memory cell.

As an example, in the memory device 10, the word line decoder 21 and the bit line decoder 22 may be disposed below the cell area 30. In other words, the cell area 30 may be disposed above the word line decoder 21 and the bit line decoder 22. A design of wirings connecting the word lines WL and the word line decoder 21 to each other and connecting the bit lines BL and the bit line decoder 22 to each other may be simplified using the structure as described above. According to example embodiments, the read/write circuit 23 may also be disposed below the cell area 30 together with the word line decoder 21 and the bit line decoder 22.

Figure 2:
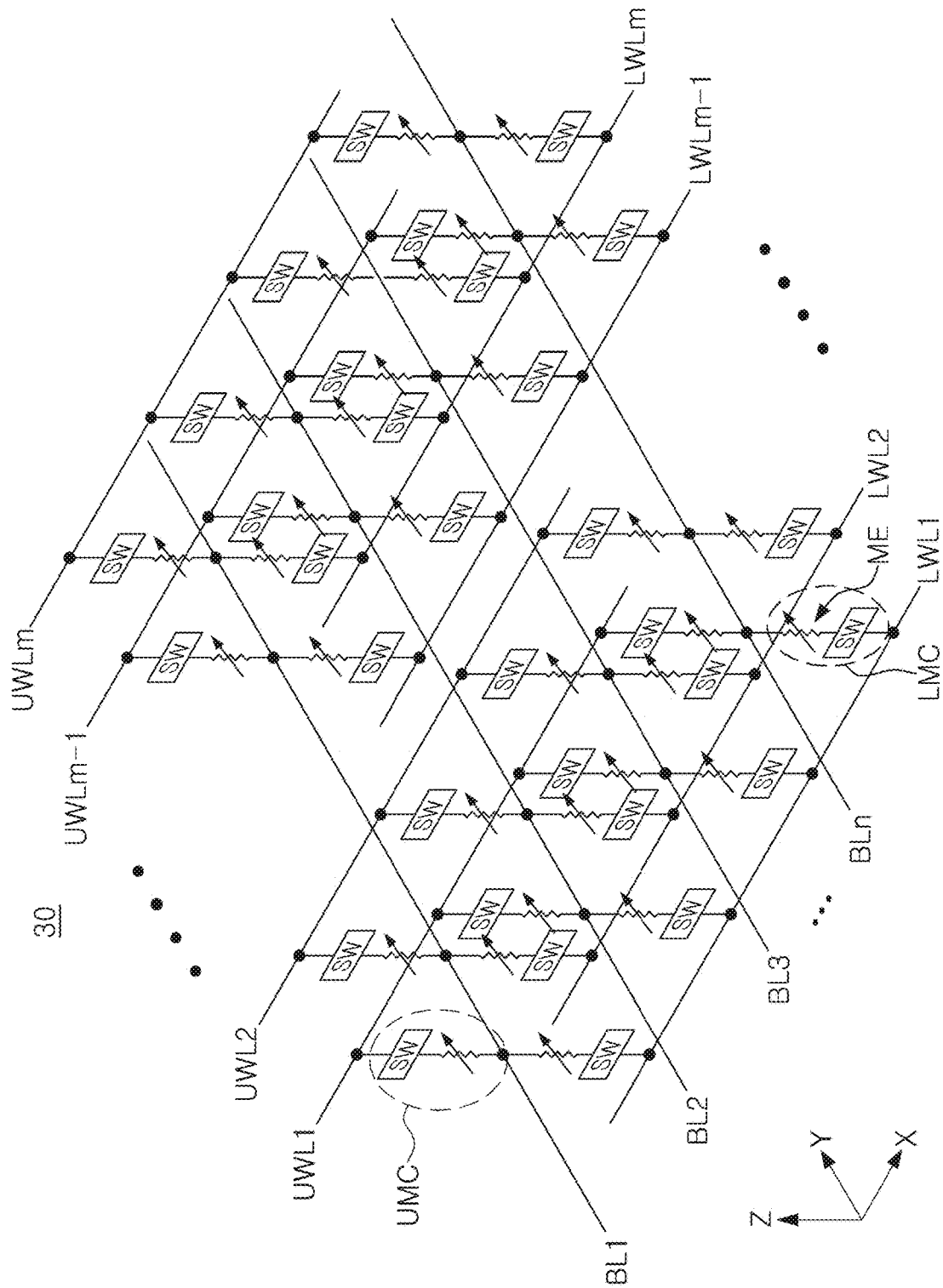
FIG. 2 is a schematic view illustrating a memory cell array of the memory device according to example embodiments.

FIG. 2 is a schematic view illustrating the cell area of the memory device according to example embodiments.

Referring to FIG. 2, the cell area 30 may include bit lines BL1 to BLn extending in a first direction (a Y-axis direction) and word lines LWL1 to LWLm and UWL1 to UWLm extending in a second direction (an X-axis direction). The first direction and the second direction may be directions intersecting each other, and may be perpendicular to each other as an example.

Lower memory cells LMC may be disposed between the bit lines BL1 to BLn and lower word lines LWL1 to LWLm, and upper memory cells UMC may be disposed between the bit lines BL1 to BLn and upper word lines UWL1 to UWLm.

The lower memory cells LMC and the upper memory cells UMC may have the same structure.

For example, each of the lower memory cells LMC and the upper memory cells UMC may include a switch element SW and a memory element ME. In example embodiments, the switch element SW may be an Ovonic threshold switch (OTS). In example embodiments, the memory element ME may be formed of a phase change material including a chalcogenide material, a super-lattice and/or the like. In other words, the memory element ME may include a phase change material capable of phase transition between an amorphous phase and a crystalline phase depending on a heating time, a temperature and/or the like.

In each of the memory cells LMC and UMC, the memory element ME and the switch element SW may be connected to each other in series. A connection order of the memory elements ME and the switch elements SW is not limited to that illustrated in FIG. 2 and may be modified. As an example, the memory elements ME and the switch elements SW may be sequentially connected between the word lines LWL1 to LWLm and UWL1 to UWLm and the bit lines BL1 to BLn.

In example embodiments illustrated in FIG. 2, the bit lines BL1 to BLn may be disposed between the lower memory cells LMC and the upper memory cells UMC in a third direction (a Z-axis direction) and may be shared by the lower memory cells LMC and the upper memory cells UMC. However, this is an example, and a structure of the memory cell array 40 may be modified. As an example, word lines may be disposed between the lower memory cells LMC and the upper memory cells UMC, such that the lower memory cells LMC and the upper memory cells UMC may share the word lines with each other. In some example embodiments, the lower memory cells LMC may be connected to lower bit lines, and the upper memory cells UMC may be connected to upper bit lines.

Figure 3:
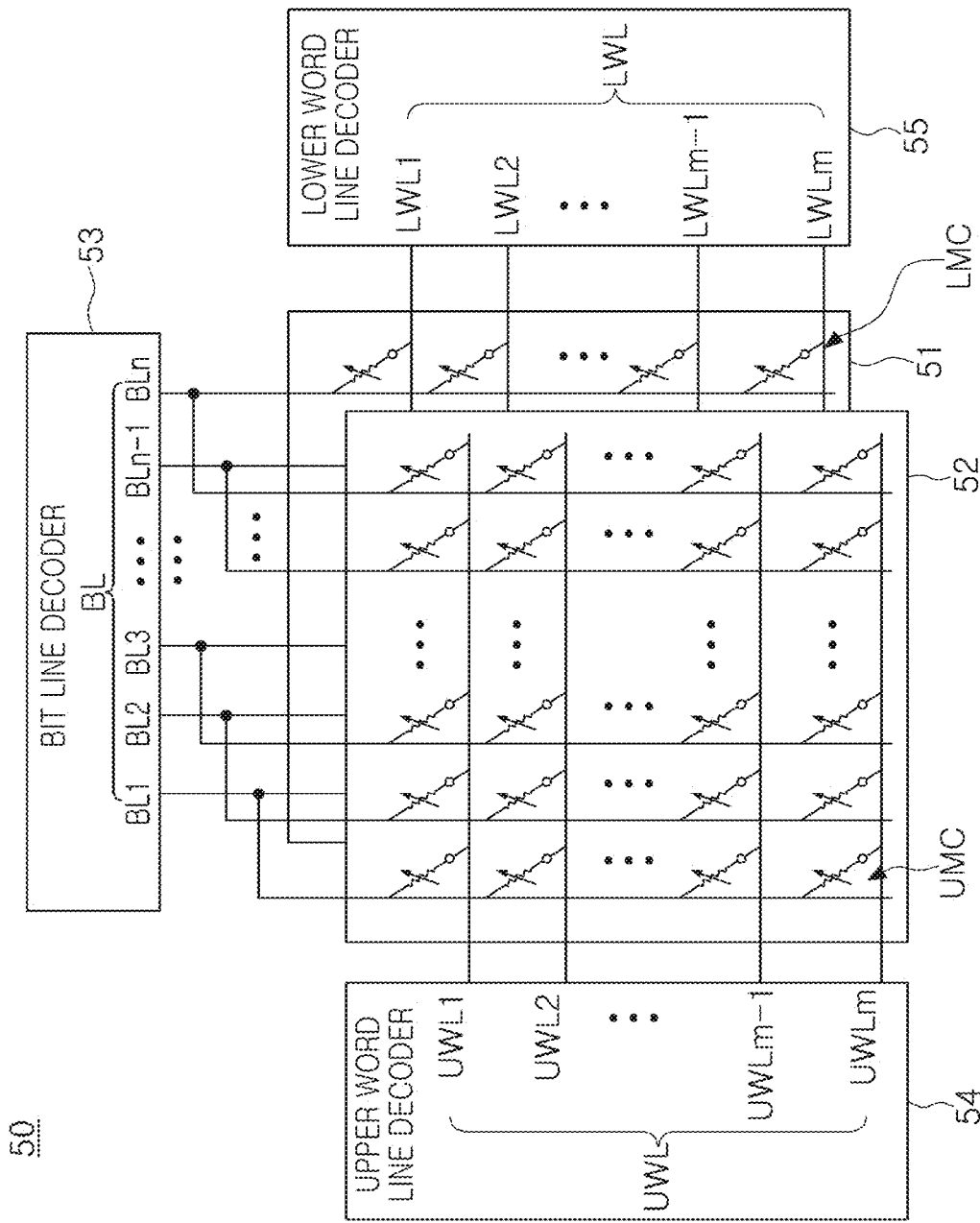
FIGS. 3 and 4 are schematic block diagrams illustrating memory devices according to example embodiments.
Figure 4:
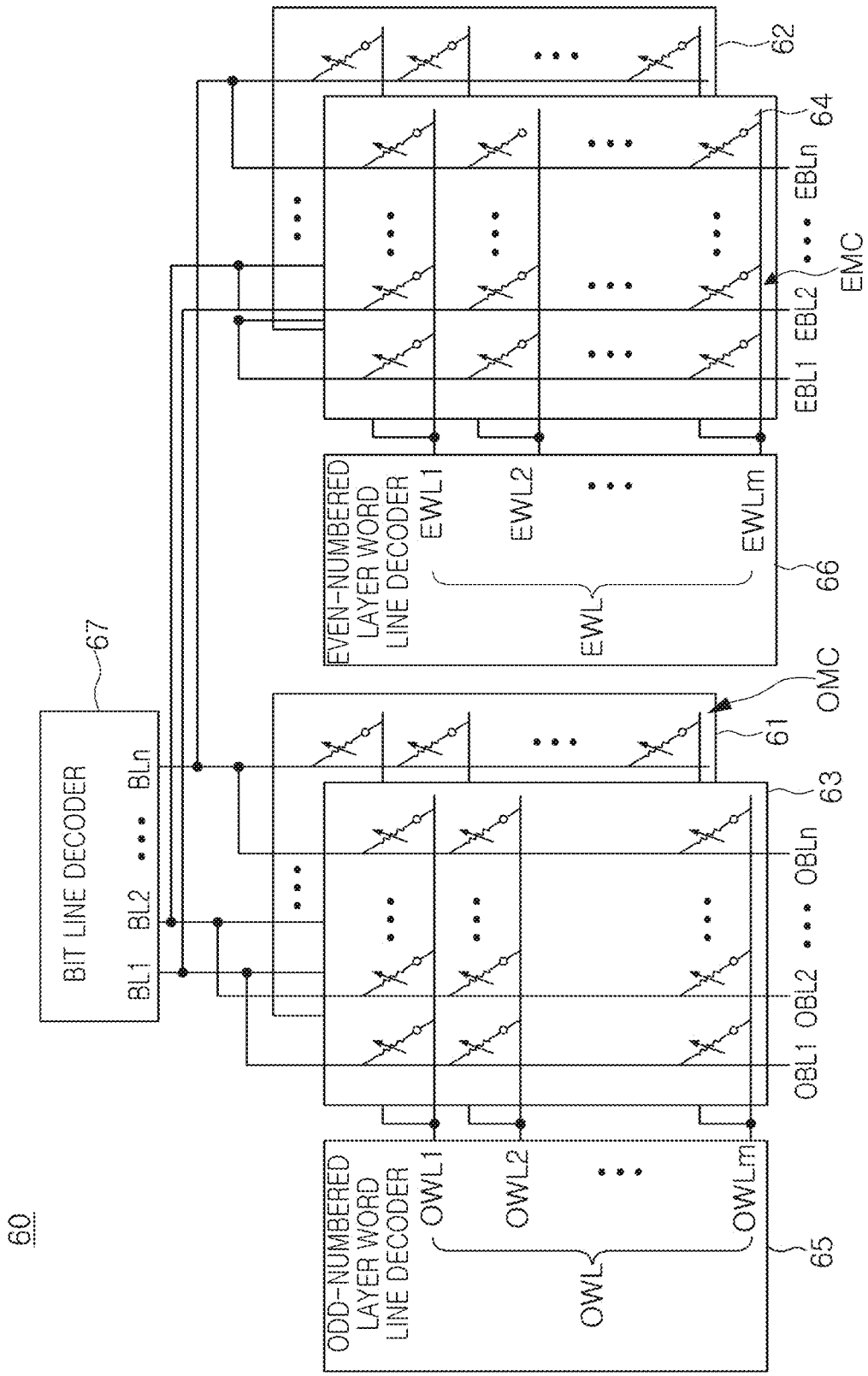

FIGS. 3 and 4 are schematic block diagrams illustrating memory devices according to example embodiments.

First, referring to FIG. 3, a memory device 50 according to example embodiments may include a plurality of memory layers 51 and 52. The plurality of memory layers 51 and 52 may include a first memory layer 51 and a second memory layer 52. Lower memory cells LMC included in the first memory layer 51 may be connected to lower word lines LWL, and upper memory cells UMC included in the second memory layer 52 may be connected to upper word lines UWL.

The upper memory cells UMC and the lower memory cells LMC may share bit lines BL with each other. As an example, the upper memory cells UMC may be connected to an upper portion of each of the bit lines BL, and the lower memory cells LMC may be connected to a lower portion of each of the bit lines BL. Although the upper memory cells UMC and the lower memory cells LMC share the bit lines BL with each other, the upper memory cells UMC and the lower memory cells LMC may be independently controlled. For example, when a bit line decoder 53 selects a first bit line BL1 and an upper word line decoder 54 selects a first upper word line UWL1, a lower word line decoder 55 may not select a first lower word line LWL1. Therefore, an upper memory cell UMC connected between the first bit line BL1 and the first upper word line UWL1 may be controlled.

It has been illustrated in example embodiments illustrated in FIG. 3 that the number of upper word lines UWL is the same as that of lower word lines LWL, but the number of upper word lines UWL and the number of lower word lines LWL are not necessarily limited thereto. As an example, the number of upper word lines UWL may be more than that of lower word lines LWL, and accordingly, the number of upper memory cells UMC may be more than the number of lower memory cells LMC.

Next, referring to FIG. 4, a memory device 60 according to example embodiments may include a plurality of memory layers 61 to 64. The plurality of memory layers 61 to 64 may include a first memory layer 61, a second memory layer 62, a third memory layer 63, and a fourth memory layer 64 that are sequentially stacked. In example embodiments, odd-numbered layer memory cells OMC included in the first memory layer 61 and the third memory layer 63 may be connected to an odd-numbered layer word line decoder 65 through odd-numbered layer word lines OWL. Even-numbered layer memory cells EMC included in the second memory layer 62 and the fourth memory layer 64 may be connected to an even-numbered layer word line decoder 66 through even-numbered layer word lines EWL. However, according to example embodiments, the memory layers 61 to 64 may be connected to different word line decoders, respectively.

In example embodiments illustrated in FIG. 4, bit lines BL may be shared by the odd-numbered layer memory cells OMC and the even-numbered layer memory cells EMC. As an example, the bit lines BL may include lower bit lines disposed between the first memory layer 61 and the second memory layer 62 and upper bit lines disposed between the third memory layer 63 and the fourth memory layer 64. As an example, a lower bit line and an upper bit line disposed at the same position on a plane perpendicular to a stacked direction of the memory layers 61 to 64 may be electrically connected to each other. Therefore, when a bit line decoder 67 selects one of the bit lines BL, the lower bit line and the upper bit line may be simultaneously selected. However, according to example embodiments, the lower bit lines and the upper bit lines may be electrically disconnected from each other, and may be individually selected by different bit line decoders.

Figure 5:
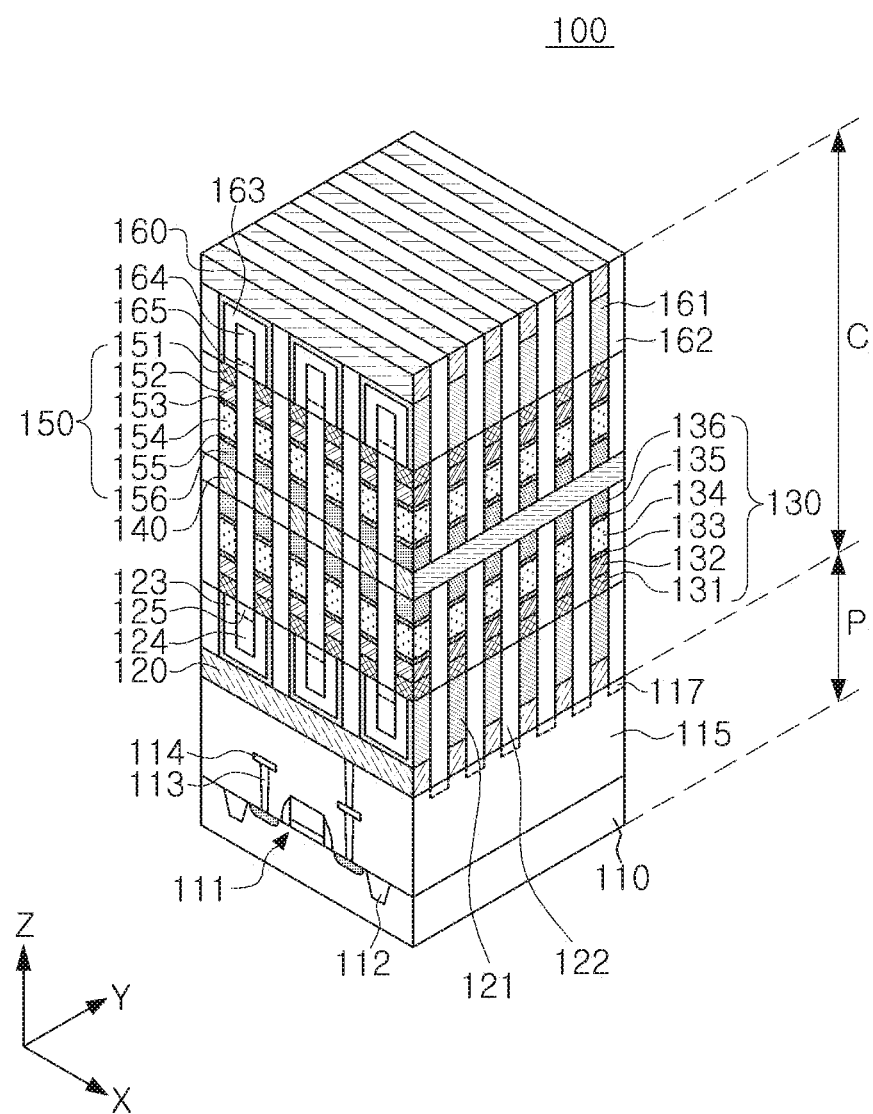
FIG. 5 is a view illustrating a structure of a memory device according to example embodiments.

FIG. 5 is a view illustrating a structure of a memory device according to example embodiments.

Referring to FIG. 5, a memory device 100 may include a peripheral circuit area P having a plurality of circuit units 111 formed on a semiconductor substrate 110 and a cell area C having a plurality of memory cells 130 and 150. The cell area C may include a plurality of bit lines 140 extending in a first direction (a Y-axis direction) and a plurality of word lines 120 and 160 extending in a second direction (an X-axis direction).

As an example, the cell area C may include lower word lines 120 disposed below the bit lines 140 in a third direction (a Z-axis direction) and upper word lines 160 disposed above the bit lines 140 in the third direction (the Z-axis direction). Lower memory cells 130 may be disposed between the bit lines 140 and the lower word lines 120, and upper memory cells 150 may be disposed between the bit lines 140 and the upper word lines 160.

The circuit units 111 may be adjacent to a unit isolation film 112 in at least one of the first direction and the second direction, and may be connected to circuit wirings 114A through an unit contact 113. The circuit units 111 may be covered by an interlayer insulating layer 115. As an example, the circuit units 111 illustrated in FIG. 5 may provide a lower word line decoder connected to the lower word lines 120.

The lower word lines 120 may be connected to a heating electrode layer 121. It has been illustrated in example embodiments illustrated in FIG. 5 that the heating electrode layer 121 is connected to a pair of lower memory cells 130 adjacent to each other in the second direction, but this is only an example and the heating electrode layer 121 and the lower memory cells 130 are not necessarily limited thereto. For example, each of the lower memory cells 130 may also be connected to one heating electrode layer 121. In a process of forming the heating electrode layer 121 and the lower word lines 120, recess portions 117 may be formed.

The heating electrode layers 121 may be separated from each other by lower insulating patterns 122. Insulating spacers 123 and internal insulating layers 124 and 125 may be disposed in the heating electrode layer 121. Each of the lower insulating pattern 122, the insulating spacer 123, and the internal insulating layers 124 and 125 may be formed of silicon oxide, silicon nitride or the like.

Each of the lower memory cells 130 may include a variable resistance layer 131 in contact with the heating electrode layer 121 and a first electrode layer 132, a selection unit layer 134, a second electrode layer 136, and/or the like, sequentially stacked on the variable resistance layer 131. According to example embodiments, a first interface layer 133 and a second interface layer 135 may be disposed between the selection unit layer 134 and the first electrode layer 132 and between the selection unit layer 134 and the second electrode layer 136, respectively.

The variable resistance layer 131 may be formed of a material whose phase change may be generated by heat transferred from the heating electrode layer 121. As an example, the variable resistance layer 131 may include Ge—Sb—Te (GST), or the like, which is a chalcogenide material. Alternatively, the variable resistance layer 131 may be formed of a material including at least two units selected from the group consisting of Si, Ge, Sb, Te, Bi, In, Sn, and Se, as a chalcogenide material.

The selection unit layer 134 may include a material whose resistance changes depending on a magnitude of a voltage applied thereacross, and may include, for example, an Ovonic threshold switching (OTS) material. The OTS material may include a chalcogenide switching material. In example embodiments, the selection unit layer 134 may include Si, Te, As, Ge, In, or combinations thereof or may further include nitrogen. A material of the selection unit layer 134 is not limited to those described above, and may include various material layers capable of functioning to select an unit.

The upper memory cells 150, a heating electrode layer 161, and the upper word lines 160 may be disposed above the bit lines 140. Referring to FIG. 5, the heating electrode layer 161 may be connected to the upper word lines 160. In addition, the heating electrode layers 161 may be separated from each other by upper insulating patterns 162. Insulating spacers 163 and internal insulating layers 164 and 165 may be disposed in the heating electrode layer 161.

The upper memory cells 150 may have the same structure as the lower memory cells 130. For example, each of the upper memory cells 150 may include a variable resistance layer 151 in contact with the heating electrode layer 161 and a first electrode layer 152, a selection unit layer 154, a second electrode layer 156, and/or the like, sequentially stacked beneath the variable resistance layer 151. Similar to the lower memory cells 130, a first interface layer 153 and a second interface layer 155 may be disposed between the selection unit layer 154 and the first electrode layer 152 and between the selection unit layer 154 and the second electrode layer 156, respectively.

Figure 6A:
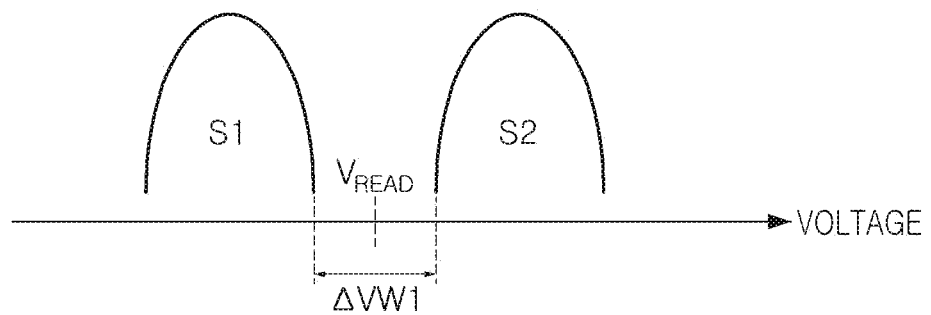
FIGS. 6A and 6B are views illustrating a threshold voltage distribution of memory cells in the memory device according to example embodiments.
Figure 6B:
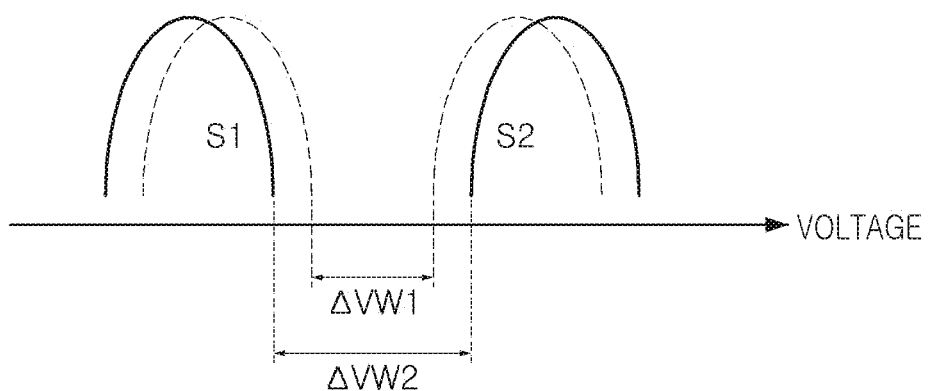

FIGS. 6A and 6B are views illustrating a threshold voltage distribution of memory cells in the memory device according to example embodiments.

First, referring to FIG. 6A, the memory cells may have a first state S1 or a second state S2. As an example, the memory cells in the first state S1 may have threshold voltages in a first voltage range, and the memory cells in the second state S2 may have threshold voltages in a second voltage range greater than the first voltage range. In example embodiments, in each of the memory cells in the first state S1, the memory element may have a relatively small resistance, and in each of the memory cells in the second state S2, the memory element may have a relatively great resistance. For example, the first state S1 may be a state in which a phase change material included in the memory element has a crystalline phase, and may be defined as a set state. In addition, the second state S2 may be a state in which the phase change material included in the memory element has an amorphous phase, and may be defined as a reset state.

A predetermined or alternatively, desired voltage window may exist between the threshold voltage in the first state S1 and the threshold voltage in the second state S2, and a read operation of the memory device may be executed by inputting a read voltage belonging to the voltage window to the selected memory cell. As an example, referring to FIG. 6A, after a programming operation, the threshold voltage in the first state S1 and the threshold voltage in the second state S2 may have a difference by a first voltage window ΔVW1 therebetween.

A memory controller of the memory device may execute a read operation by inputting a read voltage $V_{READ}$ belonging to the first voltage window ΔVW1 to the selected memory cell. When the selected memory cell is in the first state S1, the selected memory cell may be turned on by the read voltage $V_{READ}$, while when the selected memory cell is in the second state S2, the selected memory cell may not be turned on by the read voltage $V_{READ}$.

Therefore, when the first voltage window ΔVW1 between the threshold voltage in the first state S1 and the threshold voltage in the second state S2 decreases, reliability of the memory device may decrease. As an example, as the first voltage window ΔVW1 decreases, the selected memory cell in the first state S1 may not be turned on or the selected memory cell in the second state S2 may be turned on by the read voltage $V_{READ}$, resulting in erroneous reading of data.

In order to secure a voltage window between the threshold voltage in the first state S1 and the threshold voltage in the second state S2 and improve the reliability of the memory device, the voltage window between the first state S1 and the second state S2 may be increased from the first voltage window ΔVW1 to a second voltage window ΔVW2, as illustrated in FIG. 6B. Illustratively, in order to increase the voltage window between the first state S1 and the second state S2, a refresh operation may be executed every predetermined or alternatively, desired cycle or whenever necessary. As an example, the refresh operation may be executed in a manner of turning on only the switch element in each of the memory cells, and the threshold voltages of the memory cells having the first state S1 may decrease by the refresh operation.

Alternatively, after a programming operation of setting a state of the selected memory cell to the first state S1 or the second state S2, a post voltage may be input to the selected memory cell. After the programming operation, the threshold voltages of the memory cells may increase due to the post voltage input to the selected memory cell, and thus, the voltage window may be increased. However, when the post voltage is input to the selected memory cell for each programming operation, a time and consumed power required for the programming operation may increase, such that performance of the memory device may be deteriorated.

As an example, for the purpose of increasing the voltage window, the post voltage may be input to the selected memory cell after a programming operation of setting the state of the selected memory cell to the second state S2. The post voltage may be input after the input of a program voltage for setting the state of the selected memory cell to the second state S2 has ended and a predetermined or alternatively, desired waiting time has elapsed, and a time for which the post voltage is input to the selected memory cell may be longer than a time for which the program voltage is input and the waiting time. Therefore, when the post voltage is input to the selected memory cell for each programming operation of setting the state of the selected memory cell to the second state S2, an execution time and consumed power of the programming operation may excessively increase, which may cause performance deterioration of the memory device.

In example embodiments, in the refresh operation, a state of each of the memory cells may be determined as the first state S1 or the second state S2, and the post voltage may be selectively input to the memory cells whose state is determined as the second state S2. As an example, the refresh operation may be defined as including a first refresh operation of turning on only the switch element in each of the memory cells and a second refresh operation of inputting the post voltage to the memory cells in the second state S2. Since the threshold voltages of the memory cells having the first state S1 decrease in the first refresh operation and the threshold voltages of the memory cells having the second state S2 increase in the second refresh operation, the voltage window may be sufficiently secured between the first state S1 and the second state S2 to improve reliability of the memory device. In other words, in example embodiments, the voltage window may be sufficiently secured between the threshold voltage in the first state S1 and the threshold voltage in the second state S2 without inputting the post voltage to the selected memory cell in the programming operation.

Figure 7:
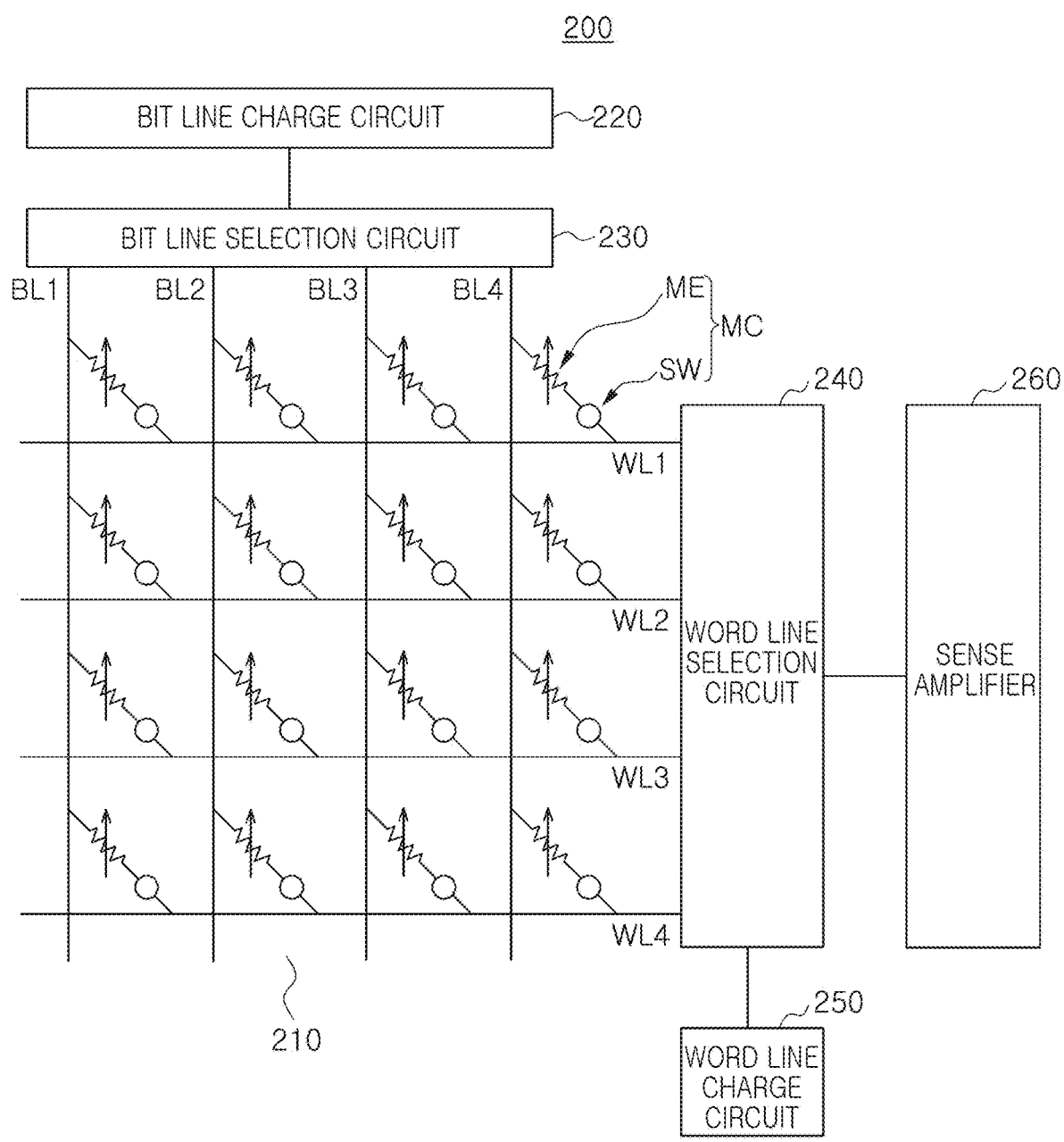
FIGS. 7 and 8 are views provided in order to illustrate operations of memory devices according to example embodiments.
Figure 8:
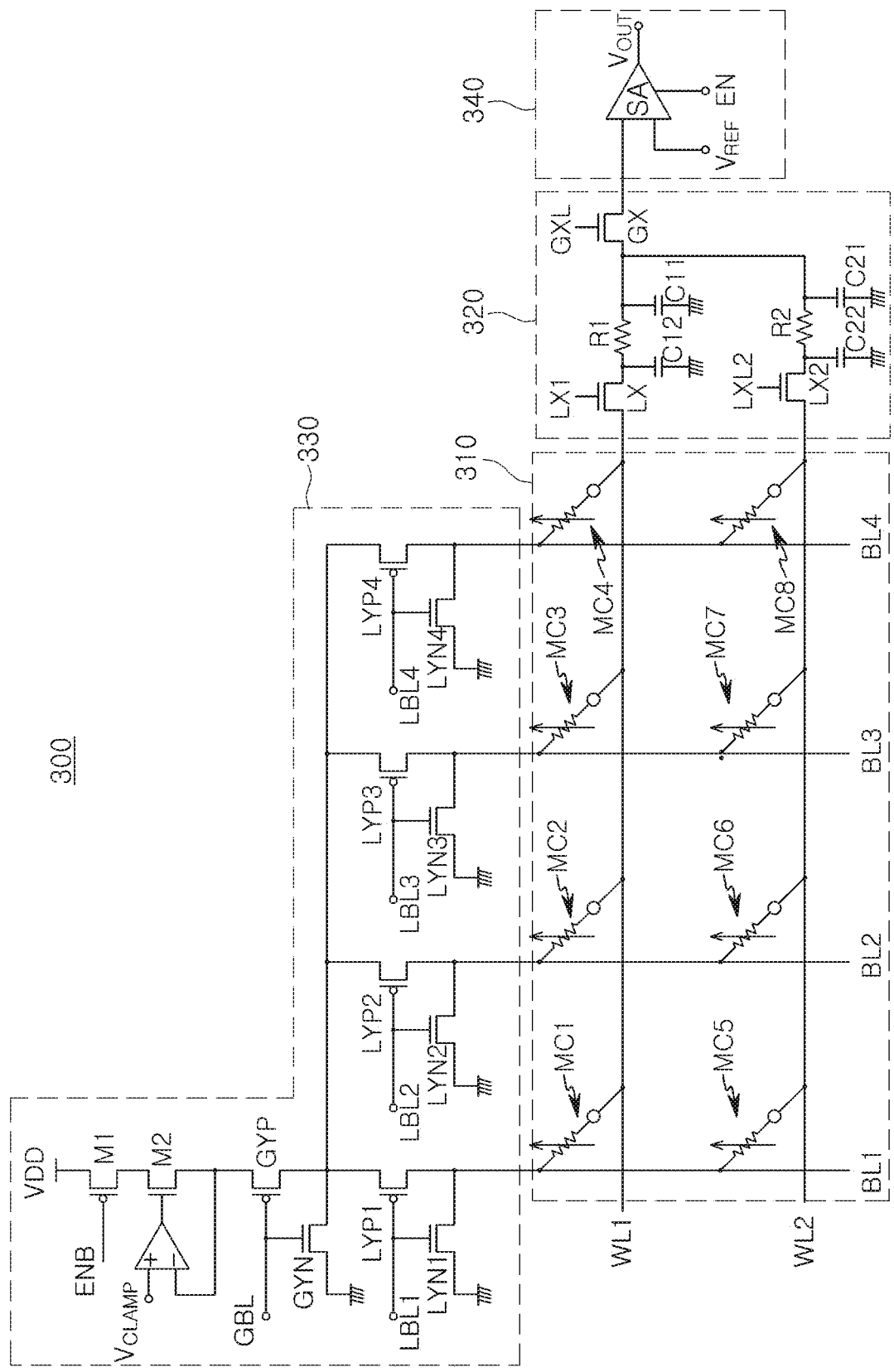

FIGS. 7 and 8 are views provided in order to illustrate operations of memory devices according to example embodiments.

Referring to FIG. 7, a memory device 200 according to example embodiments may include a cell area 210, a bit line charging circuit 220, a bit line selecting circuit 230, a word line selecting circuit 240, a word line charging circuit 250, a sense amplifier 260, and/or the like. The bit line charging circuit 220, the bit line selecting circuit 230, the word line selecting circuit 240, the word line charging circuit 250, and/or the sense amplifier 260 may be included in a peripheral circuit area. The cell area 210 may include memory cells MC, each of which may include a switch element SW and a memory element ME. The memory cells MC may be connected to bit lines BL1 to BL4 and word lines WL1 to WL4. The numbers of memory cells MC, bit lines BL1 to BL4, and word lines WL1 to WL4 may be variously modified according to example embodiments.

The bit line charging circuit 220 may be connected to the bit lines BL1 to BL4 through the bit line selecting circuit 230. The bit line selecting circuit 230 may determine a selected bit line and an unselected bit line of the bit lines BL1 to BL4. In a programming operation, a read operation, a refresh operation, or the like, different voltages may be input to the selected bit line and the unselected bit line. The voltages input to the selected bit line and the unselected bit line may be determined by the bit line charging circuit 220 and the bit line selecting circuit 230.

The word line charging circuit 250 and the sense amplifier 260 may be connected to the word lines WL1 to WL4 through the word line selecting circuit 240. The word line selecting circuit 240 may determine a selected word line and an unselected word line of the word lines WL1 to WL4. In a programming operation, a read operation, a refresh operation, or the like, voltages input to the selected word line and the unselected word line may be determined by the word line charging circuit 250 and the word line selecting circuit 240.

The memory device 200 according to example embodiments may execute the refresh operation every predetermined or alternatively, desired cycle or the peripheral circuit area may execute the refresh operation in response to a refresh command received from an external memory controller. The cycle in which the refresh operation is executed may be determined depending on a time, the number of times of execution of the programming operation or the read operation, and/or the like, and the memory controller may transmit a refresh command to the memory device every predefined time. In example embodiments, as the number of times of execution of the read operation is accumulated or a time elapses after the programming operation, a voltage window between a threshold voltage of memory cells in a set state and a threshold voltage of memory cells in a reset state may decrease.

In example embodiments, the peripheral circuit area may input a first refresh voltage to at least some refresh cells of the memory cells MC in the refresh operation, and the first refresh voltage may be a voltage turning on the switch element SW included in each of the memory cells MC. During a period in which the first refresh voltage is input, the peripheral circuit area may determine a state of each of the memory cells MC as a first state or a second state. As an example, the peripheral circuit area may determine each of the memory cells MC to which the first refresh voltage is input as one of a first refresh cell in the first state and a second refresh cell in the second state. The first state may be a set state in which the memory element ME has a relatively small resistance, and the second state may be a reset state in which the memory element ME has a relatively great resistance.

The peripheral circuit area may input a second refresh voltage, different from the first refresh voltage to the second refresh cell in the second state. As an example, the first refresh voltage may be a voltage capable of executing the read operation, and may be greater than a maximum threshold voltage that the first refresh cells in the set state may have. During the period in which the first refresh voltage is input, the sense amplifier 260 needs to be enabled to determine the state of each of the memory cells MC as the first state or the second state, and the first refresh voltage may thus be determined at a magnitude at which the first refresh cells are turned on and the second refresh cells are not turned on.

The second refresh voltage may be lower than or equal to a minimum threshold voltage that the second refresh cells in the reset state may have. In addition, in example embodiments, the second refresh voltage may be greater than the first refresh voltage. The second refresh voltage may be greater than the first refresh voltage so as to be input to the second refresh cells to increase threshold voltages of the second refresh cells.

Next, referring to FIG. 8, a memory device 300 according to example embodiments may include a cell area 310, a word line decoder 320, a bit line decoder 330, a sense amplifier 340, and/or the like. The word line decoder 320, the bit line decoder 330, and/or the sense amplifier 340 may be included in a peripheral circuit area.

Only two word lines WL1 and WL2 and four bit lines BL1 to BL4 have been illustrated in example embodiments of FIG. 8, but the numbers of word lines and bit lines may be variously modified. The cell area 310 may include memory cells MC1 to MC8 connected to the word lines WL1 to WL2 and the bit lines BL1 to BL4.

The word line decoder 320 may be connected to the word lines WL1 and WL2, determine one of the word lines WL1 and WL2 as a selected word line for a refresh operation, and input a word line voltage to the selected word line. As an example, the word line voltage may be a negative voltage. As an example, a circuit for inputting the word line voltage may be connected between a second switch element GX and the sense amplifier 340.

Each of the word lines WL1 and WL2 may be connected to at least one switch element included in the word line decoder 320. As an example, a first word line WL1 may be connected to the sense amplifier 340 through a first switch element LX1 and the second switch element GX. A second word line WL2 may be connected to the sense amplifier 340 through a first switch element LX1 and the second switch element GX.

In example embodiments illustrated in FIG. 8, the first word line WL1 and the second word line WL2 may share one second switch element GX and the sense amplifier 340 with each other. Therefore, when the first word line WL1 is selected in the refresh operation, the second word line WL2 may not be selected. However, according to example embodiments, the first word line WL1 and the second word line WL2 may also be connected to different second switch elements GX and the sense amplifier 340. In some example embodiments, the first word line WL1 and the second word line WL2 may be simultaneously selected and the refresh operation may be performed.

Next, referring to the bit line decoder 330, each of the bit lines BL1 to BL4 may be connected to a pair of switch elements. Describing a first bit line BL1 as an example, the first bit line BL1 may be connected to a first selected switch element LYP1 and a first unselected switch element LYN1. The first selected switch element LYP1 may be turned on when the first bit line BL1 is determined as a selected bit line, and the first unselected switch element LYN1 may be turned on when the first bit line BL1 is determined as an unselected bit line. As an example, the first selected switch element LYP1 may be a P-channel metal oxide semiconductor (PMOS) transistor, and the first unselected switch element LYN1 may be an N-channel metal oxide semiconductor (NMOS) transistor. The first selected switch element LYP1 and the first unselected switch element LYN1 may receive, in common, a first bit line control signal LBL1 input through gate terminals thereof.

The bit lines BL1 to BL4 may share one common selected switch element GYP and a common unselected switch element GYN with each other. The common selected switch element GYP may be a PMOS transistor, and the common unselected switch element GYN may be an NMOS transistor. The common selected switch element GYP and the common unselected switch element GYN may receive, in common, a common bit line control signal GBL input through gate terminals thereof.

The sense amplifier 340 may include an operational amplifier SA whose first input terminal may be connected to the word lines WL1 and WL2 and second input terminal may be connected to a reference voltage $V_{REF}$. The sense amplifier 340 may output an output voltage $V_{OUT}$ corresponding to a comparison result between a voltage of the first input terminal and the reference voltage $V_{REF}$.

A refresh operation of the memory device 300 will hereinafter be described with reference to FIGS. 9 and 10.

Figure 9:
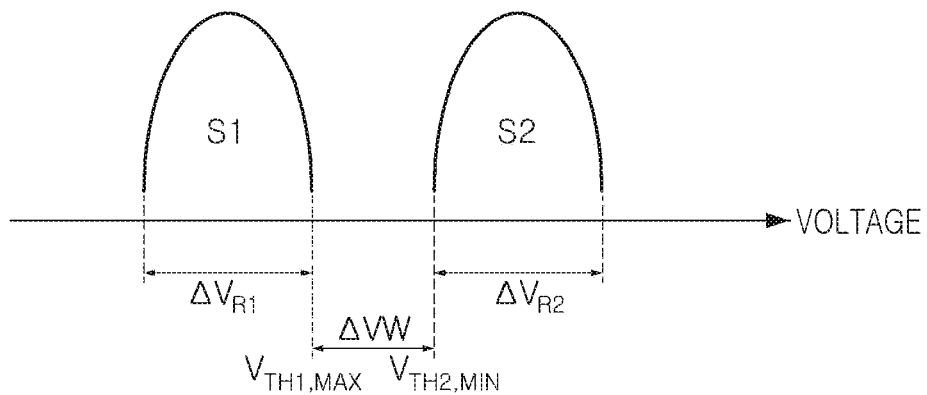
FIGS. 9 and 10 are views provided in order to illustrate an operation of the memory device according to example embodiments.
Figure 10:
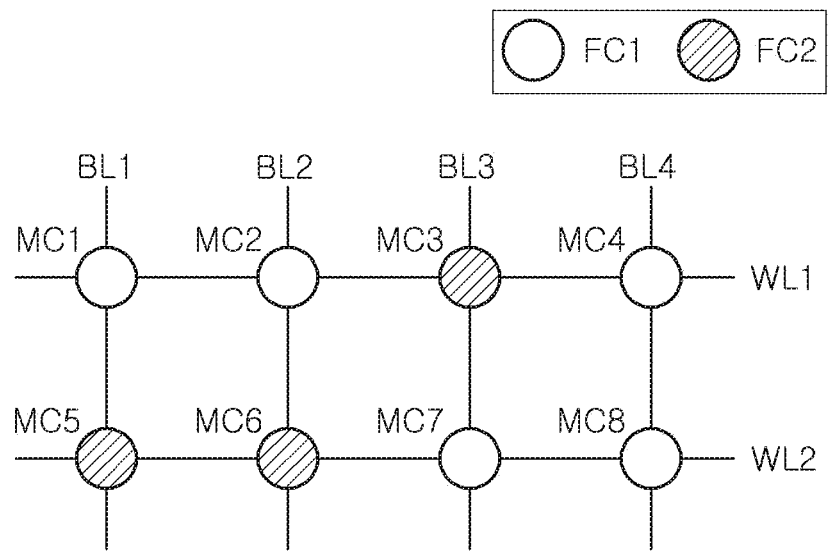

FIGS. 9 and 10 are views provided in order to illustrate an operation of the memory device according to example embodiments.

Referring to FIG. 9, each of the memory cells MC1 to MC8 may have a first state S1 or a second state S2. The first state S1 may be a state in which the memory cell has a threshold voltage in a first range $\Delta V_{R1}$, and the second state S2 may be a state in which the memory cell has a threshold value in a second range $\Delta V_{R2}$ greater than the first range $\Delta V_{R1}$. A voltage window $\Delta VW$ may exist between the first range $\Delta V_{R1}$ and the second range $\Delta V_{R2}$.

As described above, during a period in which the first refresh voltage is input to the memory cells MC1 to MC8 in the refresh operation, a state of the memory cells MC1 to MC8 may be determined as the first state S1 or the second state S2. Each of the memory cells MC1 to MC8 may be determined as a first refresh cell FC1 having the first state S1 or a second refresh cell FC2 having the second state S2. In example embodiments illustrated in FIG. 10, third, fifth, and sixth memory cells MC3, MC5, and MC6 may be determined as the second refresh cells FC2, and the remaining memory cells MC1, MC2, MC4, MC7, and MC8 may be determined as the first refresh cells FC1.

Since the state of each of the memory cells MC1 to MC8 needs to be determined as the first state S1 or the second state S2 during the period in which the first refresh voltage is input, the first refresh voltage may be greater than a maximum threshold voltage ($V_{TH1,MAX}$) in the first range $\Delta V_{R1}$. As an example, during a period in which the bit line decoder 330 selects the first bit line BL1 and the word line decoder 320 selects the second word line WL2, such that the first refresh voltage is input, the sense amplifier 340 may be enabled. Since the fifth memory cell MC5 connected to the first bit line BL1 and the second word line WL2 has the second state S2, a voltage input to the sense amplifier 340 through the second word line WL2 may be greater than the reference voltage $V_{REF}$.

The second refresh voltage may be input to the second refresh cell FC2 having the second state S2 like the fifth memory cell MC5. The second refresh voltage may be higher than or equal to the first refresh voltage, and may be smaller than a minimum threshold voltage $V_{TH2,MIN}$ in the second range $\Delta V_{R2}$. The second range $\Delta V_{R2}$, which is a threshold voltage range that the second refresh cell FC2 may have may increase due to the second refresh voltage. Therefore, the voltage window $\Delta VW$ between the first range $\Delta V_{R1}$ and the second range $\Delta V_{R2}$ may increase, and reliability of the memory device 300 may be improved.

The second refresh voltage may not be input to the memory cells determined as the first refresh cell FC1 by receiving the first refresh voltage and enabling the sense amplifier 340. As the second refresh voltage is input, threshold voltages of the memory cells MC1 to MC8 may increase, and when the second refresh voltage is input to the first refresh cell FC1, the voltage window $\Delta VW$ may rather decrease. Therefore, in example embodiments, the states of the memory cells MC1 to MC8 may be determined during the period in which the first refresh voltage is input, and the second refresh voltage may be input only to the second refresh cell FC2 having the second state S2 to additionally secure the voltage window $\Delta VW$.

Figure 11:
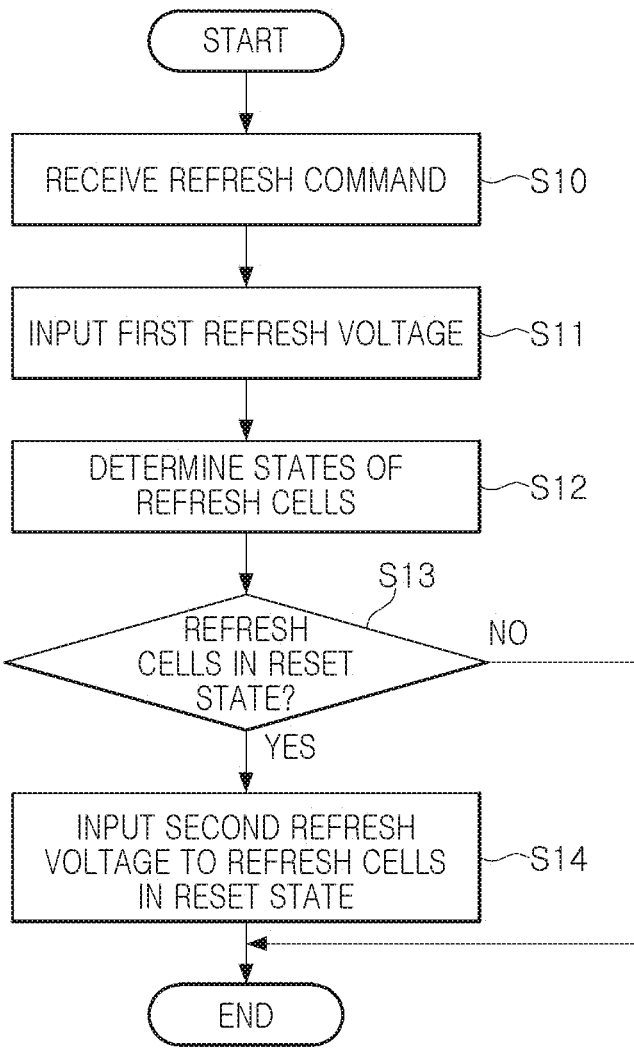
FIG. 11 is a flowchart provided in order to illustrate an operation of the memory device according to example embodiments.

FIG. 11 is a flowchart provided in order to illustrate an operation of the memory device according to example embodiments.

Referring to FIG. 11, an operation of the memory device according to example embodiments may start with reception of a refresh command (S10). As an example, the memory device may receive the refresh command from an external memory controller. However, according to example embodiments, a refresh operation may be executed even when the refresh command is not received.

When the refresh command is received, the peripheral circuit area of the memory device may input the first refresh voltage to the refresh cells, which are at least some of the memory cells of the cell area (S11), and determine the state of each of the refresh cells (S12). An operation of inputting the first refresh voltage to the refresh cells and determining the state of each of the refresh cells may be defined as a first refresh operation.

The peripheral circuit area may determine whether or not there are refresh cells in a reset state in the first refresh operation (S13). As an example, the peripheral circuit area may determine the state of each of the refresh cells receiving the first refresh voltage as one of the set state and the reset state by enabling the sense amplifier included in the read/write circuit.

The second refresh voltage may be input to the refresh cells determined to be in the reset state in S13 (S14). An operation in which the peripheral circuit area inputs the second refresh voltage to the refresh cells determined to be in the reset state may be defined as a second refresh operation. In other words, in the memory device according to example embodiments, the first refresh operation and the second refresh operation may be sequentially executed for the refresh cells. Since the second refresh operation is executed only for the refresh cells determined to be in the reset state in the first refresh operation, the number of refresh cells receiving the first refresh voltage may be more than the number of refresh cells receiving the second refresh voltage.

Figure 12:
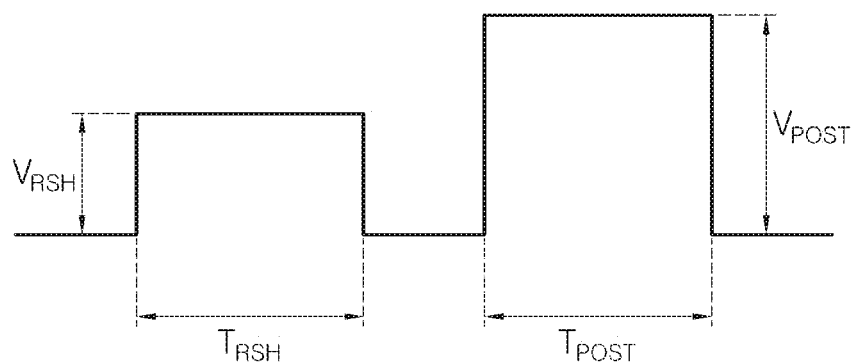
FIGS. 12 through 13B are views provided in order to illustrate an operation of the memory device according to example embodiments.
Figure 13A:
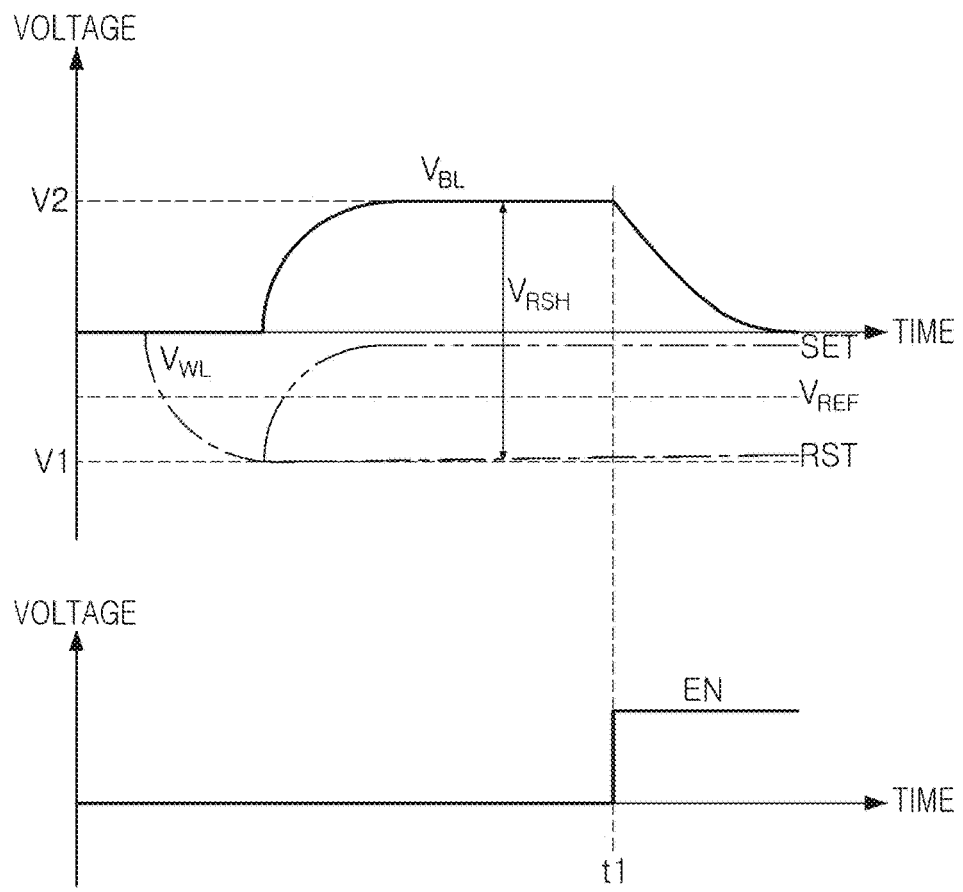
Figure 13B:
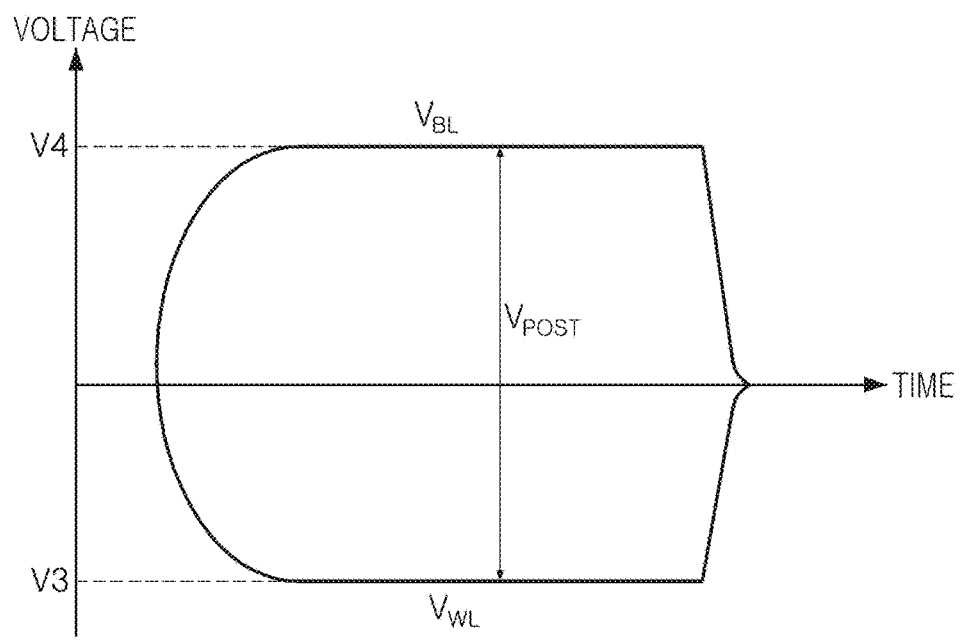

FIGS. 12 through 13B are views provided in order to illustrate an operation of the memory device according to example embodiments.

As described above, the memory device according to example embodiments may include the cell area and the peripheral circuit area, and the cell area may include the plurality of memory cells. The plurality of memory cells may be connected to the peripheral circuit area through the plurality of word lines and the plurality of bit lines. The peripheral circuit area may record data by adjusting a resistance of each of the plurality of memory cells to change a threshold voltage of each of the plurality of memory cells. As an example, by a programming operation of writing the data, each of the plurality of memory cells may have a set state in which a threshold voltage thereof is lower than or equal to a first threshold voltage or may have a reset state in which a threshold voltage thereof is higher than or equal to a second threshold voltage, different from the first threshold voltage. As an example, the second threshold voltage may be higher than the first threshold voltage.

Referring to FIG. 12, the peripheral circuit area may sequentially execute a first operation and a second operation. The first operation may be a refresh operation of initializing a threshold voltage of a switch element included in each of at least some refresh cells of the memory cells using a refresh voltage $V_{RSH}$ capable of turning on the switch element. On the other hand, the second operation may be an operation of inputting a post voltage $V_{POST}$ to at least some target memory cells of the refresh cells. The target memory cells may be cells having the reset state among the refresh cells.

As an example, the first operation may be executed for a refresh operation time $T_{RSH}$, and the second operation may be executed for a post operation time $T_{POST}$. The refresh voltage $V_{RSH}$ input to the refresh cells in the first operation may be higher than the first threshold voltage and be smaller than the second threshold voltage. The post voltage $V_{POST}$ input to the target memory cells in the second operation may be smaller than the second threshold voltage. According to example embodiments, the post operation time $T_{POST}$ may be set to be longer than the refresh operation time $T_{RSH}$ so that threshold voltages of the target memory cells having the reset state may be sufficiently increased by the post voltage $V_{POST}$.

As an example, a magnitude of the post voltage $V_{POST}$ may vary depending on threshold voltage distributions of the memory cells having the set state and the memory cells having the reset state. For example, when a part of the threshold voltage distribution of the memory cells having the set state overlaps a part of the threshold voltage distribution of the memory cells having the reset state, the post voltage $V_{POST}$ may be equal to the refresh voltage $V_{RSH}$ or may be greater than the refresh voltage $V_{RSH}$ by a first voltage difference. On the other hand, when the threshold voltage distribution of the memory cells having the set state does not overlap the threshold voltage distribution of the memory cells having the reset state, the post voltage $V_{POST}$ may be greater than the refresh voltage $V_{RSH}$ by a second voltage difference greater than the first voltage difference.

FIG. 13A is a view illustrating voltages of a bit line BL and a word line WL connected to each of the refresh cells during the first operation, and FIG. 13B is a view illustrating voltages of a bit line BL and a word line WL connected to each of the target memory cells during the second operation.

First, referring to FIG. 13A, the word line decoder in the peripheral circuit area may pre-charge the word line connected to the refresh cell in order to execute the first operation. As an example, the word line may be pre-charged with a first voltage V1, which is a negative voltage, and a word line voltage $V_{WL}$ may increase up to the first voltage V1 due to the pre-charging. When the word line voltage $V_{WL}$ increases up to the first voltage V1, the word line decoder may float the word line.

When the pre-charging for the word line is completed, the bit line decoder may pre-charge the bit line connected to the refresh cell. As an example, the bit line decoder may pre-charge the bit line with a second voltage V2, which is a positive voltage, and a bit line voltage $V_{BL}$ may increase up to the second voltage V2 as illustrated in FIG. 13A. In example embodiments, the first voltage V1 and the second voltage V2 may have the same magnitude.

In example embodiments illustrated in FIG. 13A, the refresh voltage $V_{RSH}$ input to the refresh cell during the first operation may be determined as a difference between the bit line voltage $V_{BL}$ and the word line voltage $V_{WL}$. The switch element included in the refresh cell may be turned on and a threshold voltage of the switch element may be initialized, by the refresh voltage $V_{RSH}$. As the threshold voltage of the switch element is initialized, a threshold voltage of the refresh cell may decrease. In addition, the sense amplifier connected to the refresh cell may be operated by an enable signal EN after a first point in time t1. The sense amplifier may compare the word line voltage $V_{WL}$ at the first point in time t1 or after the first point in time t1 with a reference voltage $V_{REF}$.

The refresh cell may have a set state SET in which the threshold voltage is lower than or equal to the first threshold voltage or a reset state RST in which the threshold voltage is higher than or equal to the second threshold voltage, different from the first threshold voltage. As illustrated in FIG. 13A, when the refresh cell is in the set state, the word line voltage $V_{WL}$ may be greater than the reference voltage $V_{REF}$, and when the refresh cell is in the reset state, the word line voltage $V_{WL}$ may be smaller than the reference voltage $V_{REF}$.

As described with reference to FIG. 12, when the refresh cell is determined to be in the reset state RST in the first operation, the peripheral circuit area may determine the refresh cell as the target memory cell and additionally perform the second operation. Referring to FIG. 13B, in the second operation, the word line voltage $V_{WL}$ may be pre-charged with a third voltage V3 and the bit line voltage $V_{BL}$ may be pre-charged with a fourth voltage V4. As an example, a magnitude of the fourth voltage V4 may be higher than or equal to that of the third voltage V3.

Therefore, the post voltage $V_{POST}$ determined by a difference between the third voltage V3 and the fourth voltage V4 may be input to the target memory cell in the reset state RST during the second operation. According to example embodiments, the post voltage $V_{POST}$ may be greater than the refresh voltage $V_{RSH}$.

The peripheral circuit area may increase the threshold voltage by inputting the post voltage $V_{POST}$ to the target memory cell. The threshold voltage distribution of the memory cells may be improved and the reliability of the memory device may be improved, by decreasing the threshold voltage through initialization of the switch element of each of the refresh cells in the first operation and selectively performing the second operation only on target memory cells having the reset state RST.

In addition, in example embodiments, the post voltage $V_{POST}$ is selectively input only to the target memory cells having the reset state RST in the refresh operation to increase the threshold voltages. Therefore, the post voltage $V_{POST}$ does not need to be input in another control operation such as the programming operation. Therefore, consumed power, a time and/or the like required for another control operation such as the programming operation may be reduced. In example embodiments, a magnitude of the post voltage $V_{POST}$ may be smaller than a program voltage input to a program memory cell intended to be programmed in the programming operation.

Figure 14:
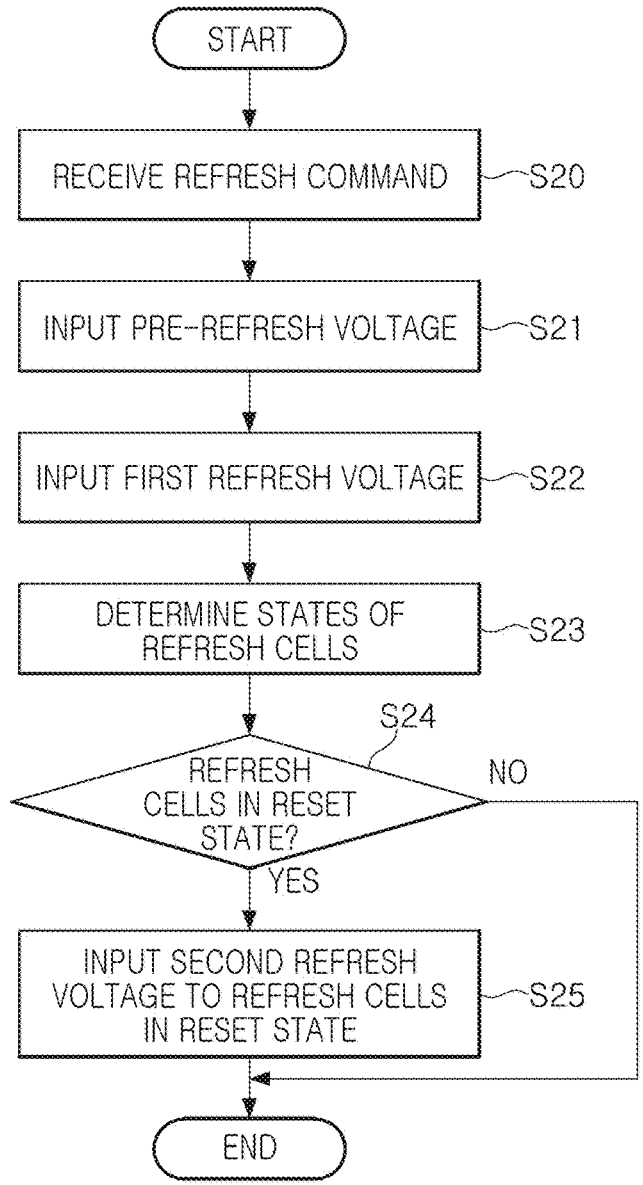
FIG. 14 is a flowchart provided in order to illustrate an operation of the memory device according to example embodiments.

FIG. 14 is a flowchart provided in order to illustrate an operation of the memory device according to example embodiments.

Referring to FIG. 14, an operation of the memory device according to example embodiments may start with reception of a refresh command (S20). As an example, the memory device may receive the refresh command from an external memory controller. However, according to example embodiments, a refresh operation may be executed even when the refresh command is not received.

When the refresh command is received, the peripheral circuit area of the memory device may input a pre-refresh voltage to the refresh cells, which are at least some of the memory cells of the cell area (S21). After the pre-refresh voltage is input, the peripheral circuit area may input a first refresh voltage to the refresh cells (S22), and determine a state of each of the refresh cells (S23). In example embodiments, the pre-refresh voltage may have a magnitude higher than or equal to that of the first refresh voltage, and a time for which the pre-refresh voltage is input may be shorter than a time for which the first refresh voltage is input. An operation of inputting the first refresh voltage to the refresh cells and determining the state of each of the refresh cells may be defined as a first refresh operation.

The peripheral circuit area may determine whether or not there are refresh cells in a reset state in the first refresh operation (S24). As an example, the peripheral circuit area may determine a state of each of the refresh cells as one of the set state and the reset state by enabling the sense amplifier connected to the refresh cells.

The second refresh voltage may be input to the refresh cells determined to be in the reset state in S24 (S25). An operation in which the peripheral circuit area inputs the second refresh voltage to the refresh cells determined to be in the reset state may be defined as a second refresh operation. In other words, the peripheral circuit area of the memory device according to example embodiments may sequentially input the pre-refresh voltage and the first refresh voltage to the refresh cells, and sequentially input the pre-refresh voltage, the first refresh voltage, and the second refresh voltage to some refresh cells.

Figure 15:
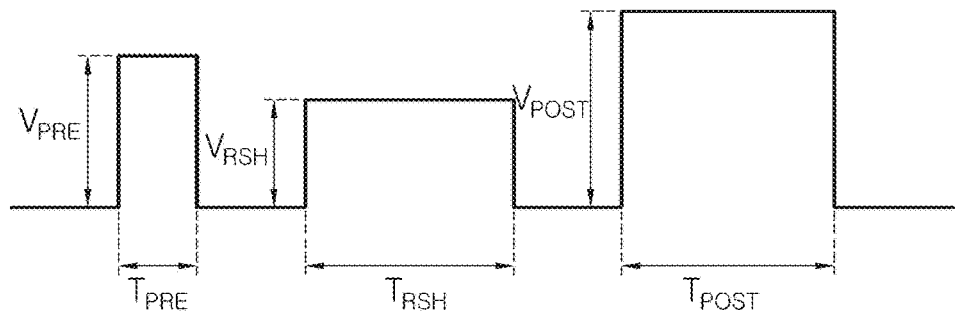
FIGS. 15 through 16C are views provided in order to illustrate an operation of the memory device according to example embodiments.
Figure 16A:
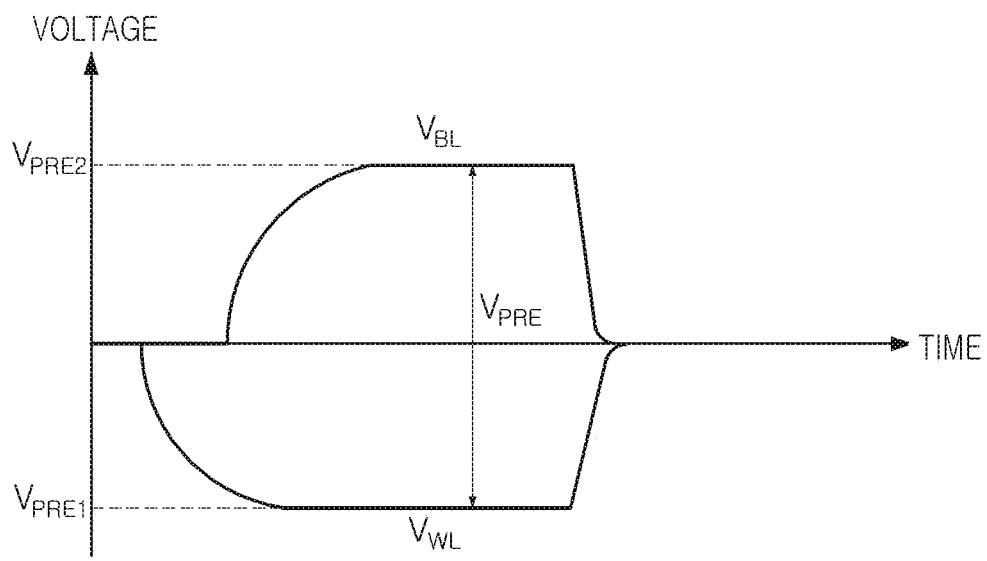
Figure 16B:
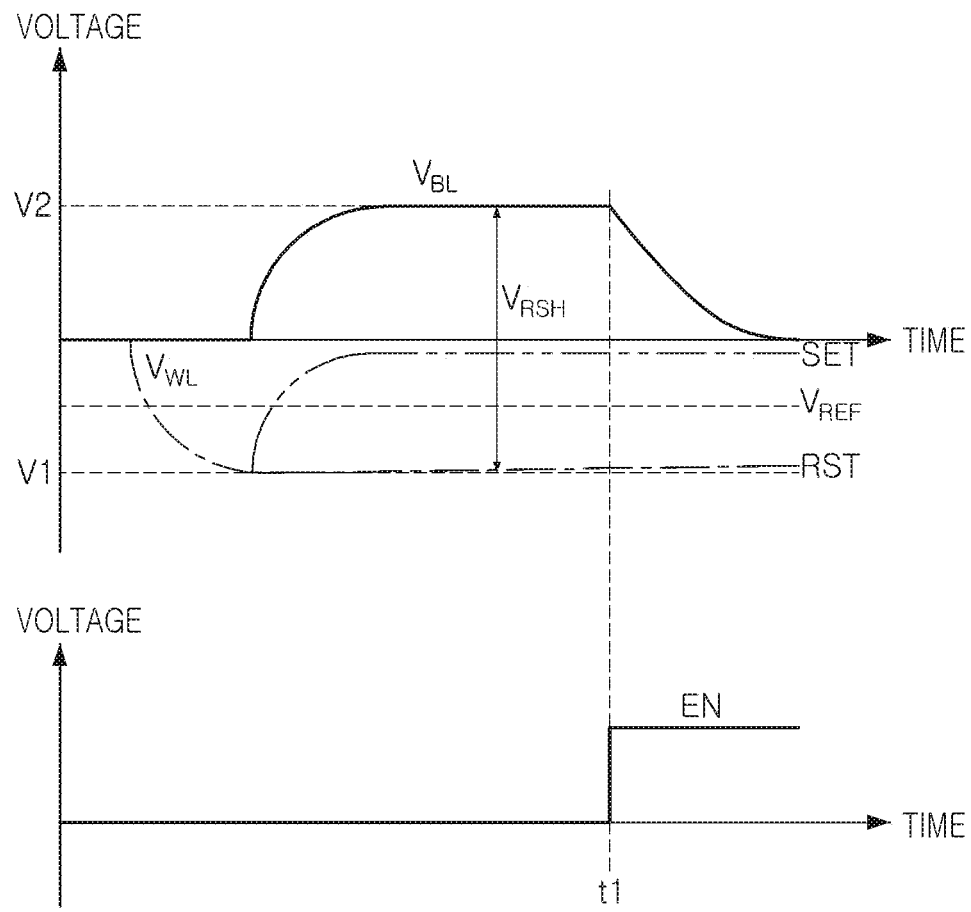
Figure 16C:
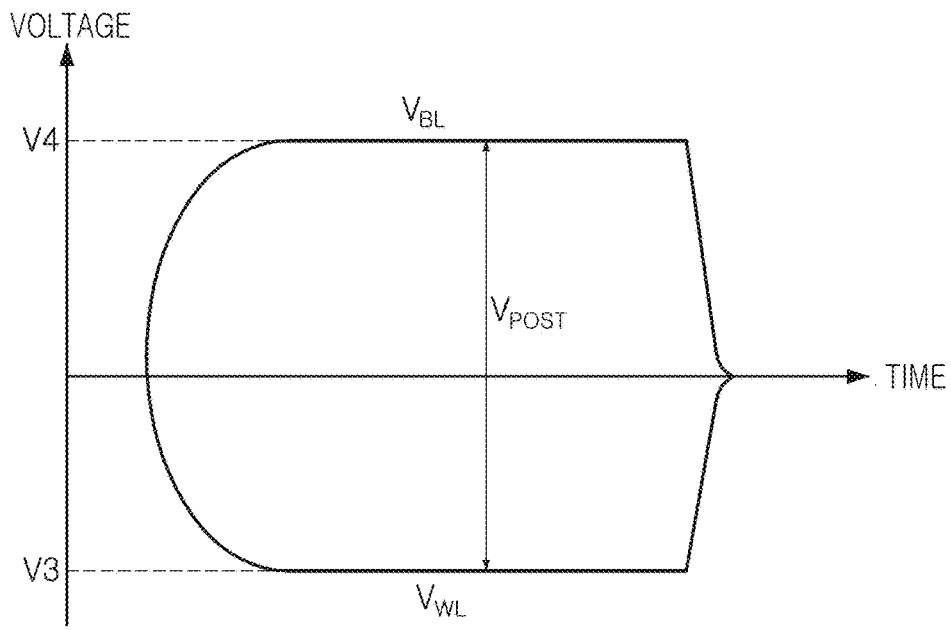

FIGS. 15 through 16C are views provided in order to illustrate an operation of the memory device according to example embodiments.

Referring to FIG. 15, in the memory device according to example embodiments, the peripheral circuit area may additionally execute a pre-refresh operation prior to the first operation and the second operation included in the refresh operation. A pre-refresh operation time $T_{PRE}$ for which the pre-refresh operation is executed may be shorter than the refresh operation time $T_{RSH}$ for which the first operation is executed and the post operation time $T_{POST}$ for which the second operation is executed.

As an example, a pre-refresh voltage $V_{PRE}$ may be greater than the refresh voltage $V_{RSH}$, and may turn on the switch element to compensate for an increase in a threshold voltage generated due to a drift or the like in the switch element. A magnitude of the pre-refresh voltage $V_{PRE}$ may be determined depending on a threshold voltage distribution of the memory cells. For example, when a part of the threshold voltage distribution of the memory cells having the set state overlaps a part of the threshold voltage distribution of the memory cells having the reset state, the pre-refresh voltage $V_{PRE}$ may have the same or substantially the same magnitude as the refresh voltage $V_{RSH}$. On the other hand, when the threshold voltage distribution of the memory cells having the set state does not overlap the threshold voltage distribution of the memory cells having the reset state, the pre-refresh voltage $V_{PRE}$ may be greater than the refresh voltage $V_{RSH}$. A magnitude of the post voltage $V_{POST}$ may be determined in a manner similar to that described above with reference to FIG. 12.

FIG. 16A is a view illustrating voltages of a bit line BL and a word line WL connected to each of the refresh cells during the pre-refresh operation. FIG. 16B is a view illustrating voltages of a bit line BL and a word line WL connected to each of the refresh cells during the first operation, and FIG. 16C is a view illustrating voltages of a bit line BL and a word line WL connected to each of the target memory cells during the second operation.

Referring to FIG. 16A, the word line decoder of the peripheral circuit area may pre-charge each of word lines and bit lines connected to the refresh cells in order to input the pre-refresh voltage $V_{PRE}$. As an example, the word line may be pre-charged with a first pre-voltage $V_{PRE1}$, and the bit line may be pre-charged with a second pre-voltage $V_{PRE2}$. When the pre-charging is completed, the switch element included in the refresh cell may be turned on by the pre-refresh voltage $V_{PRE}$. As an example, the pre-refresh voltage $V_{PRE}$ may decrease again a threshold voltage increased due to a drift phenomenon in the switch element of the refresh cell.

Next, referring to FIG. 16B, the word line decoder and the bit line decoder of the peripheral circuit area may pre-charge each of the word line and the bit line connected to the refresh cell. As an example, the word line may be pre-charged with a first voltage V1, which is a negative voltage, and a word line voltage $V_{WL}$ may increase up to the first voltage V1 due to the pre-charging. When the word line voltage $V_{WL}$ increases up to the first voltage V1, the word line decoder may float the word line.

The word line voltage $V_{WL}$ may increase when the bit line decoder pre-charges the bit line. In some example embodiments, an increase width in the word line voltage $V_{WL}$ may vary depending on the threshold voltage of the refresh cell. When the refresh cell is in the set state SET in which it has a low threshold voltage, the word line voltage $V_{WL}$ may increase relatively greatly, and when the refresh cell is in the reset state RST in which it has a high threshold voltage, the word line voltage $V_{WL}$ may increase relatively small. The sense amplifier connected to the refresh cell may be operated by an enable signal EN after a first point in time t1. The sense amplifier may compare the word line voltage $V_{WL}$ at the first time point t1 or after the first time point t1 with a reference voltage $V_{REF}$.

When the refresh cell is determined to be in the reset state RST in the first operation, the peripheral circuit area may determine the refresh cell as the target memory cell and additionally perform the second operation. Referring to FIG. 16C, in the second operation, the word line voltage $V_{WL}$ may be pre-charged with a third voltage V3 and the bit line voltage $V_{BL}$ may be pre-charged with a fourth voltage V4. Therefore, the post voltage $V_{POST}$ determined by a difference between the third voltage V3 and the fourth voltage V4 may be input to the target memory cell in the reset state RST during the second operation. According to example embodiments, the post voltage $V_{POST}$ may be greater than the refresh voltage $V_{RSH}$.

The peripheral circuit area may increase the threshold voltage by inputting the post voltage $V_{POST}$ to the target memory cell. The threshold voltage distribution of the memory cells may be improved and the reliability of the memory device may be improved, by decreasing the threshold voltage by removal of an influence due to the drift phenomenon of the switch element of each of the refresh cells through turn-on of the switch element of each of the refresh cells in the first operation and increasing the threshold voltages of the refresh cells having the reset state RST in the second operation.

Figure 17:
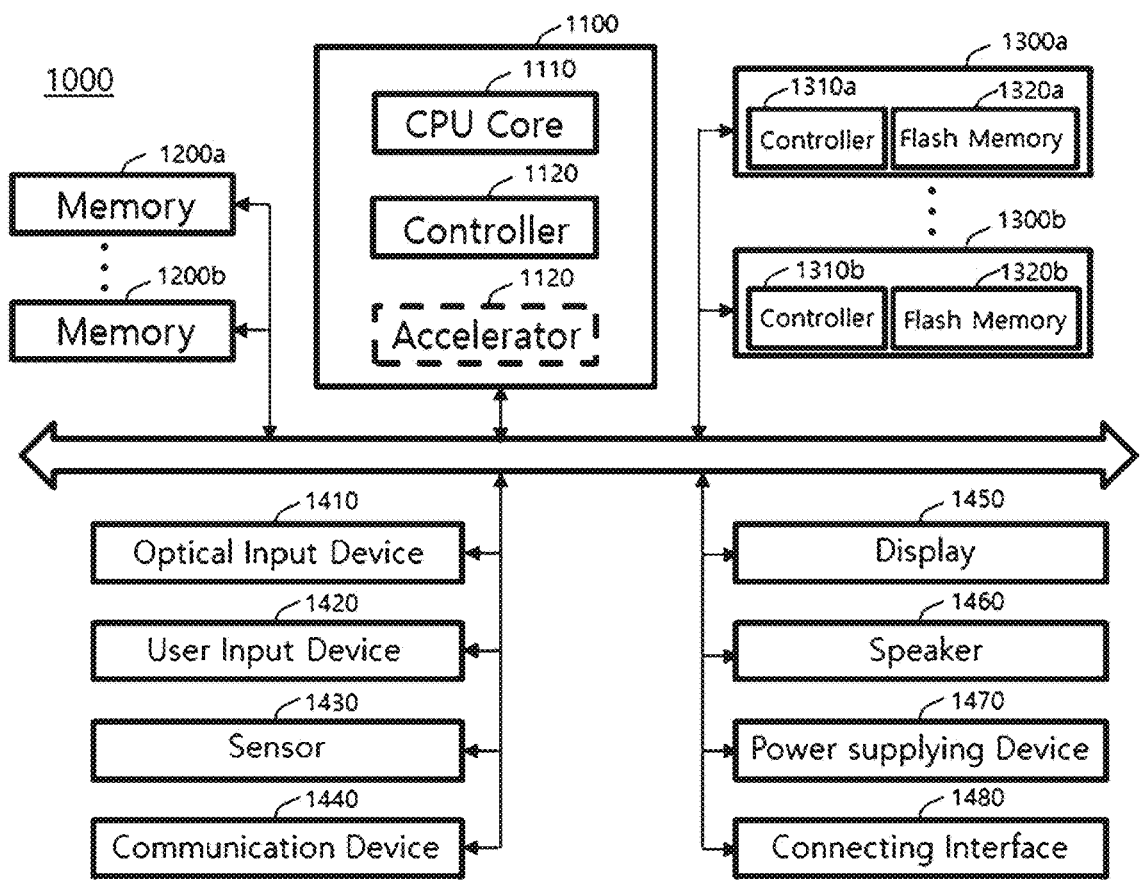
FIG. 17 is a schematic block diagram illustrating a system including the memory device according to example embodiments.

FIG. 17 is a schematic block diagram illustrating a system including the memory device according to example embodiments.

FIG. 17 is a view illustrating a system to which a storage device according to example embodiments is applied. A system 1000 illustrated in FIG. 17 may be a mobile system such as a mobile phone, a smartphone, a tablet personal computer (PC), a wearable device, a healthcare device, or an Internet of things (IOT) device. However, the system 1000 illustrated in FIG. 17 is not necessarily limited to the mobile system, and may be a personal computer, a laptop computer, a server, a media player, an automotive device such as a navigation device, or the like.

Referring to FIG. 17, the system 1000 may include a main processor 1100, memories 1200a and 1200b, and/or storage devices 1300a and 1300b, and may further include one or more of an image capturing device 1410, a user input device 1420, a sensor 1430, a communication device 1440, a display 1450, a speaker 1460, a power supplying device 1470, and/or a connecting interface 1480.

The main processor 1100 may control a general operation of the system 1000, for example, operations of the other components constituting the system 1000. The main processor 1100 may be implemented as a general-purpose processor, a dedicated processor, an application processor, or the like.

The main processor 1100 may include one or more central processing unit (CPU) cores 1110, and may further include a controller 1120 for controlling the memories 1200a and 1200b and/or the storage devices 1300a and 1300b. According to example embodiments, the main processor 1100 may further include an accelerator block 1130, which is a dedicated circuit for high-speed data operation such as artificial intelligence (AI) data operation. Such an accelerator block 1130 may include a graphics processing unit (GPU), a neural processing unit (NPU), a data processing unit (DPU), or the like, and may also be implemented as a separate chip physically independent from the other components of the main processor 1100.

The memories 1200a and 1200b may be used as main memory elements of the system 1000, and may include volatile memories such as a static random access memory (SRAM) and/or a dynamic random access memory (DRAM), but may include non-volatile memories such as a flash memory, a phase change random access memory (PRAM), and/or a resistive random access memory (RRAM). The memories 1200a and 1200b may also be implemented in the same package as the main processor 1100.

The storage devices 1300a and 1300b may function as non-volatile storage devices that store data regardless of whether or not power is supplied thereto, and may have a storage capacity relatively greater than that of the memories 1200a and 1200b. The storage devices 1300a and 1300b may include storage controllers 1310a and 1310b and non-volatile memory (NVM) storages 1320a and 1320b that store data under the control of the storage controllers 1310a and 1310b, respectively. The non-volatile memories 1320a and 1320b may include 2-dimensional (2D) structure or a 3-dimensional (3D) vertical negative AND (V-NAND) flash memories, but may also include other types of non-volatile memories such as a PRAM and/or an RRAM.

The storage devices 1300a and 1300b may be included in the system 1000 in a state in which they are physically separated from the main processor 1100 or may be implemented in the same package as the main processor 1100. In addition, the storage devices 1300a and 1300b may have a form such as a solid state device (SSD) or a memory card to be detachably coupled to the other components of the system 1000 through an interface such as a connecting interface 1480 to be described later. Such storage devices 1300a and 1300b may be devices to which a standard protocol such as universal flash storage (UFS), embedded multi-media card (eMMC), or non-volatile memory express (NVMe) is applied, but are necessarily limited thereto.

In example embodiments, at least one of the memories 1200a and 1200b and the storage devices 1300a and 1300b may be implemented as the memory devices according to example embodiments. As an example, at least one of the memories 1200a and 1200b and the storage devices 1300a and 1300b may execute the refresh operation according to example embodiments every predetermined or alternatively, desired period or in response to a refresh command transmitted from the main processor 1100. In the first refresh operation of turning on only the switch elements included in each of the memory cells, the threshold voltages of the switch elements may be initialized to decrease the threshold voltages of the memory cells having the set state. In addition, the memory cells having the reset state among the memory cells may be determined during the first refresh operation, and the second refresh operation may be selectively performed only on the memory cells in the reset state. The threshold voltages of the memory cells in the reset state may be increased by the second refresh operation, and operation performance, reliability and/or the like of the memories 1200a and 1200b and/or the storage devices 1300a and 1300b may be increased by increasing voltage margins of the memory cells.

The image capturing device 1410 may capture a still image or a moving image, and may be a camera, a camcorder, a webcam, or the like.

The user input device 1420 may receive various types of data input from a user of the system 1000, and may be a touch pad, a keypad, a keyboard, a mouse, a microphone, or the like.

The sensor 1430 may sense various types of physical quantities that may be obtained from the outside of the system 1000 and convert the sensed physical quantities into electrical signals. Such a sensor 1430 may be a temperature sensor, a pressure sensor, an illuminance sensor, a position sensor, an acceleration sensor, a biosensor, a gyroscope, or the like.

The communication device 1440 may transmit and receive signals to and from other devices outside the system 1000 according to various communication protocols. Such a communication device 1440 may be implemented to include an antenna, a transceiver, a modem, and/or the like.

The display 1450 and the speaker 1460 may function as output devices that output visual information and auditory information to the user of the system 1000, respectively.

The power supplying device 1470 may appropriately convert power supplied from a battery (not illustrated) embedded in the system 1000 and/or an external power supply and supply the converted power to respective components of the system 1000.

The connecting interface 1480 may provide a connection between the system 1000 and an external device connected to the system 1000 to be capable of transmitting and receiving data to and from the system 1000. The connecting interface 1480 may be implemented in various interface manners such as an advanced technology attachment (ATA), a serial ATA (SATA), an external SATA (e-SATA), a small computer small interface (SCSI), a serial attached SCSI (SAS), a peripheral component interconnection (PCI), a PCI express (PCIe), an NVM express (NVMe), an institute of electrical and electronic engineers (IEEE) 1394, a universal serial bus (USB), a secure digital (SD) card, a multi-media card (MMC), an embedded multi-media card (eMMC), a universal flash storage (UFS), an embedded UFS (eUFS), and a compact flash (CF) card interface.

According to example embodiments, the memory device may reads the threshold voltages of the memory cells and additionally input the refresh voltage selectively to at least some of the memory cells, during the refresh operation. Therefore, the threshold voltage distribution may be improved, such that the reliability and/or the performance of the memory device may be improved. In addition, a post-programming operation executed for the purpose of improving the threshold voltage distribution after the programming operation may be omitted, such that an operation speed of the memory device may be improved and/or consumed power of the memory device may be reduced.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The present inventive concepts are not limited by example embodiments and the accompanying drawings, and is to be limited by the claims. Therefore, various substitutions, modifications, and alterations may be made by those skilled in the art without departing from the spirit and scope of the present inventive concepts disclosed in the claims. These substitutions, modifications, and alterations are to fall within the scope of the present inventive concepts.

What is claimed is:

1. A memory device comprising:
a cell area including a plurality of word lines, a plurality of bit lines, and a plurality of memory cells connected to the plurality of word lines and the plurality of bit lines,
  each of the plurality of memory cells including an Ovonic threshold switch element and a memory element connected to each other in series; and
a peripheral circuit area including at least one peripheral circuit, the at least one peripheral circuit configured to,
  input a first refresh voltage to turn on the Ovonic threshold switch element to each of at least some refresh cells among the plurality of memory cells to execute a refresh operation,
  determine whether each of the refresh cells are a first refresh cell in a first state or a second refresh cell in a second state while the Ovonic threshold switch element is turned on, the second refresh cell in the second state having a threshold voltage greater than the first refresh cell in the first state, and
  input a second refresh voltage, different from the first refresh voltage, to the determined second refresh cells, the second refresh voltage is greater than the first refresh voltage.

2. The memory device of claim 1, wherein the at least one peripheral circuit is configured to initialize a threshold voltage of the Ovonic threshold switch element by turning on only the Ovonic threshold switch element in each of the refresh cells during the refresh operation.

3. The memory device of claim 1, wherein
the first refresh cells have a threshold voltage in a first range, and the second refresh cells have a threshold voltage in a second range greater than the first range; and
the threshold voltage of the first refresh cells is caused to decreases by the refresh operation.

4. The memory device of claim 3, wherein the second refresh voltage is lower than or equal to a minimum threshold voltage in the second range.

5. The memory device of claim 3, wherein the first refresh voltage is greater than a maximum threshold voltage in the first range.

6. The memory device of claim 1, wherein the at least one peripheral circuit is configured to execute the refresh operation in response to a refresh command received from an external memory controller.

7. The memory device of claim 6, wherein the at least one peripheral circuit is configured to receive the refresh command every predetermined cycle.

8. The memory device of claim 1, wherein the at least one peripheral circuit includes:
a bit line decoder connected to the plurality of bit lines;
a word line decoder connected to the plurality of word lines; and
a read/write circuit having sense amplifiers connected to the plurality of word lines through the word line decoder.

9. The memory device of claim 8, wherein the at least one peripheral circuit is configured to enable a sense amplifier connected to the refresh cell in which the Ovonic threshold switch element is turned on among the sense amplifiers, to determine a state of the refresh cell as the first state or the second state.

10. The memory device of claim 8, wherein
a magnitude of the second refresh voltage is determined by a difference between a bit line voltage output from the bit line decoder and a word line voltage output from the word line decoder; and
a magnitude of the bit line voltage is higher than or equal to that of the word line voltage.

11. The memory device of claim 1, wherein the at least one peripheral circuit is configured to input a pre-refresh voltage having a magnitude greater than a magnitude of the first refresh voltage to each of the refresh cells before inputting the first refresh voltage.

12. The memory device of claim 11, wherein a time for which the pre-refresh voltage is input to each of the refresh cells is shorter than a time for which the first refresh voltage is input to each of the refresh cells.

13. A memory device comprising:
a cell area including a plurality of memory cells connected to a plurality of word lines and a plurality of bit lines, each of the plurality of memory cells having a threshold voltage lower than or equal to a first threshold voltage or higher than or equal to a second threshold voltage by a programming operation, the second threshold voltage being higher than the first threshold voltage; and
a peripheral circuit area including at least one peripheral circuit connected to the plurality of word lines and the plurality of bit lines, and configured to input a post voltage to target memory cells, among the plurality of memory cells, after a control operation, wherein
each of the target memory cells has a threshold voltage higher than or equal to the second threshold voltage, and
the control operation includes a refresh operation of turning on a switch element included in each of at least some refresh cells of the plurality of memory cells, and the refresh operation including inputting a refresh voltage to the refresh cells, and
the post voltage is greater than the refresh voltage.

14. The memory device of claim 13, wherein the control operation does not include a programming operation of increasing a threshold voltage of at least one program memory cell among the plurality of memory cells to the second threshold voltage or higher.

15. The memory device of claim 13, wherein in the programming operation:

the at least one peripheral circuit is configured to input a program voltage to a program memory cell; and the post voltage is lower than the program voltage.

16. The memory device of claim 13, wherein the refresh cells include firs refresh cells having a threshold voltage lower than or equal to the first threshold voltage, and second refresh cells having a threshold voltage higher than or equal to the second threshold voltage; and the target memory cells are the second refresh cells.

17. A memory device comprising:

a plurality of word lines extending in a first direction;

a plurality of bit lines extending in a second direction, intersecting the first direction, and separated from the plurality of word lines in a third direction, intersecting the first direction and the second direction;

a plurality of memory cells connected to the plurality of word lines and the plurality of bit lines; and a peripheral circuit area including at least one peripheral circuit connected to the plurality of word lines and the plurality of bit lines, and configured to execute sequentially a first refresh operation and a second refresh operation for refresh cells of the plurality of memory cells, wherein the at least one peripheral circuit to configured to, input a first refresh voltage to the refresh cells during the first refresh operation, determine whether each of the refresh cells are a first refresh cell in a first state or a second refresh cell in a second state, the second refresh cell in the second state having a threshold voltage greater than the first refresh cell in the first state, and input a second refresh voltage, higher than the first refresh voltage to the determined second refresh cells, to execute the second refresh operation.

18. The memory drive of claim 17, wherein a first time for which the first refresh voltage is input to the refresh cells is shorter than a second time for which the second refresh voltage is input to some of the refresh cells.

* * * * *